(12) United States Patent
Tokita

(10) Patent No.: US 6,972,844 B2
(45) Date of Patent: Dec. 6, 2005

(54) MICROPROCESSING APPARATUS, SEMICONDUCTOR DEVICE MANUFACTURING APPARATUS, AND DEVICE MANUFACTURING METHOD

(75) Inventor: Toshinobu Tokita, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/951,957

(22) Filed: Sep. 28, 2004

(65) Prior Publication Data
US 2005/0105093 A1 May 19, 2005

(30) Foreign Application Priority Data
Sep. 29, 2003 (JP) .............................. 2003-337561

(51) Int. Cl.$^7$ ..................... G01B 11/00; G01B 15/00; G03F 9/00; B44C 1/22; B29C 59/16
(52) U.S. Cl. ..................... 356/401; 430/22; 216/41; 216/52; 264/406; 264/447; 264/496
(58) Field of Search ............... 250/548; 356/399–401; 430/5, 22, 30; 355/53, 55, 77; 216/11, 41–54, 216/83–85; 264/406, 447, 496

(56) References Cited
U.S. PATENT DOCUMENTS
5,772,905 A 6/1998 Chou

2002/0176096 A1 * 11/2002 Sentoku et al. ............. 356/620
2003/0081213 A1 * 5/2003 Oishi et al. ................. 356/401
2004/0021866 A1 * 2/2004 Watts et al. ................ 356/401

OTHER PUBLICATIONS

Choi et al.; "Layer-to-Layer Alignment for Step and Flash Imprint Lithography"; *Emerging Lithographic Technologies*; Proceedings of SPIE; vol. 4343, pp. 436-442;(2001).

* cited by examiner

Primary Examiner—Layla G. Lauchman
Assistant Examiner—Gordon J. Stock, Jr.
(74) Attorney, Agent, or Firm—Morgan & Finnegan, L.L.P.

(57) ABSTRACT

An illustrative object of the present invention is to provide a microprocessing apparatus by which an original and a substrate to be processed can be aligned with each other with a higher precision. Disclosed in this connection is an apparatus for transferring a pattern of an original onto a substrate while maintaining the original and the substrate in contact with each other or in close proximity to each other, wherein the apparatus includes an original holding device for holding the original, a substrate holding device for holding the substrate, a reference mark, and a position measuring system for measuring a relative positional relationship between the reference mark and a mark formed on at least one of the original and the substrate.

8 Claims, 18 Drawing Sheets

MICROPROCESSING APPARATUS, SEMICONDUCTOR DEVICE MANUFACTURING APPARATUS, AND DEVICE MANUFACTURING METHOD

FIELD OF THE INVENTION AND RELATED ART

This invention relates generally to a microprocessing apparatus for production of semiconductors, for example, such as nano-imprint lithography, soft contact lithography, near-field lithography, or proximity exposure, for example, wherein, for pattern transfer, an original having a pattern formed thereon and a workpiece substrate such as a wafer to which the patterns is to be transferred are held in contact with each other or in close proximity to each other.

Nano-imprint lithography disclosed in U.S. Pat. No. 5,772,905 is known as a technology that can take the place of conventional pattern forming methods for forming a fine pattern on a semiconductor substrate by use of ultraviolet rays, X-rays or electron beam. This technology will be explained in conjunction with FIGS. 15A–15D.

In FIG. 15A, a mold 101 that has a pattern formed thereon and that serves as an original is fixed to a mold table 102. As regards the substrate side, a resist material 104 which is to be patterned is applied onto a wafer 103.

The nano-imprint process will now be described. As shown in FIG. 15A, the mold 101 and the wafer 103 are disposed opposed to each other, and as shown in FIG. 15B, the mold 101 is pressed against the resist 104, whereby a pattern formed on the mold 101 is transferred to the resist 104. Then, the mold 101 is disengaged from the resist 104, and a surface irregularity pattern (concaved portions and protruded portions) corresponding to the pattern of the mold 101 is formed on the resist 104 (FIG. 15C). Through subsequent reactive ion etching (RIE) process, a pattern such as shown in FIG. 15D is produced.

As an alternative nano-imprint fine-patterning method, step-and-flash imprint lithography has been proposed, for example, by B. J. Choi, M. Meissl, M. Colburn, T. Bailey, P. Ruchhoeft, S. V. Sreenivasan, F. Prins, S. Banerjee, J. G. Ekerdt and C. G. Willson; "Layer-to-Layer Alignment for Step and Flash Lithography", SPIE's 26th Intl. Symp. Microlithography: Emerging Lithographic Technologies, 2001 Santa Clara, Calif. Referring to FIGS. 16A–16E, this technology will be explained.

In FIG. 16A, a resist material 104 is applied to a wafer by spin coating, and an etch barrier 121 consisting of an organic substance having low viscosity coefficient is applied to the transfer position.

Then, in FIG. 16B, an original is constituted by a template 101 and a release layer 122. The template 101 has a transfer pattern formed thereon, and it is made of quartz. On the surface of the template 101, there is a release layer 122. The template 101 and the wafer 103 are subsequently aligned with each other.

Then, as shown in FIG. 16C, ultraviolet rays are projected from the back of the template 101, that is, from the side remote from the wafer 103, by which the etch barrier 121 and the resist 121 are sensitized.

Finally, as shown in FIG. 16D, the original and the wafer 103 are disengaged from each other and, by performing reactive ion etching, a shape such as shown in FIG. 16E is obtained.

For semiconductor device manufacture, registered transfer is required. Thus, at the step of FIG. 16B, an alignment operation is carried out. The alignment measurement for such alignment is performed by setting the spacing between the original and the wafer 103 to a narrow gap and thereafter by measuring overlay patterns formed on the template and the wafer, respectively, by use of a microscope. Such overlay pattern may be a box-in-box pattern or a cross-in-box pattern.

There are some inconveniences in the above-described technologies.

U.S. Pat. No. 5,772,905 discloses a fine processing apparatus for transferring a pattern while a mold (original) and a wafer (workpiece substrate) are brought into contact with each other. However, this patent document does not mention to any specific structure in relation to relative alignment between the mold and the wafer.

In a microprocessing apparatus in which a pattern is transferred while an original and a workpiece substrate are placed in close proximity to each other, because of the flatness of the original surface or of the wafer surface, it is difficult to set the spacing between the original and the wafer to a value of approximately contacted state. Therefore, high-precision measurement is difficult to attain with the measurement method using a box-in-box pattern or a cross-in-box pattern. This directly leads to a difficulty in high-precision relative alignment between the original and the wafer (workpiece substrate).

Even if the original and the wafer have a good flatness and the gap can be set at a value of approximately contacted state, still there is a necessity of bringing them close to each other and then away from each other during every alignment operation to be made to the original and the wafer. Since this involves motions of a wafer stage and a mold holding portion, the alignment operation takes long time. This problem is not so serious in a die-by-die alignment method in which alignment of the original and the pattern transfer region of the wafer is carried out in one-to-one relation and then the pattern is transferred. However, in a global alignment method, the time required for completing the alignment operation is prolonged considerably, and it causes a decrease of throughput of the apparatus. Here, the global alignment method is an alignment method in which some transfer regions of a plurality of transfer regions upon a wafer are selected as sample transfer regions, and positions of these sample transfer regions are measured to obtain positional information which is than statistically processed to determine the positions of all the transfer regions of the wafer, including the sample transfer regions. Furthermore, there is a possibility that global alignment is carried out while an etching barrier is being adhered to the original, this being a factor for causing degradation of the alignment measurement precision and generation of particles and contaminants. A decrease of alignment measurement precision leads to degradation of overlay precision. Further, due to the decreased throughput or generation of particles or contaminants, the productivity of semiconductor device decreases. The present invention has been made in consideration of the inconveniences involved in the prior art, such as described above.

SUMMARY OF THE INVENTION

It is accordingly an illustrative object of the present invention to provide a microprocessing apparatus by which an original and a workpiece substrate to be processed can be aligned with each other at a precision significantly higher than the conventional.

In accordance with the present invention to achieve the above-described object, there is provided an apparatus for transferring a pattern of an original onto a substrate while maintaining the original and the substrate in contact with each other or in close proximity to each other, said apparatus comprising: original holding means for holding the original; substrate holding means for holding the substrate; a reference mark; and position measuring means for measuring a relative positional relationship between the reference mark and a mark formed on at least one of the original and the substrate.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

[Embodiment 1]

Figure 1:
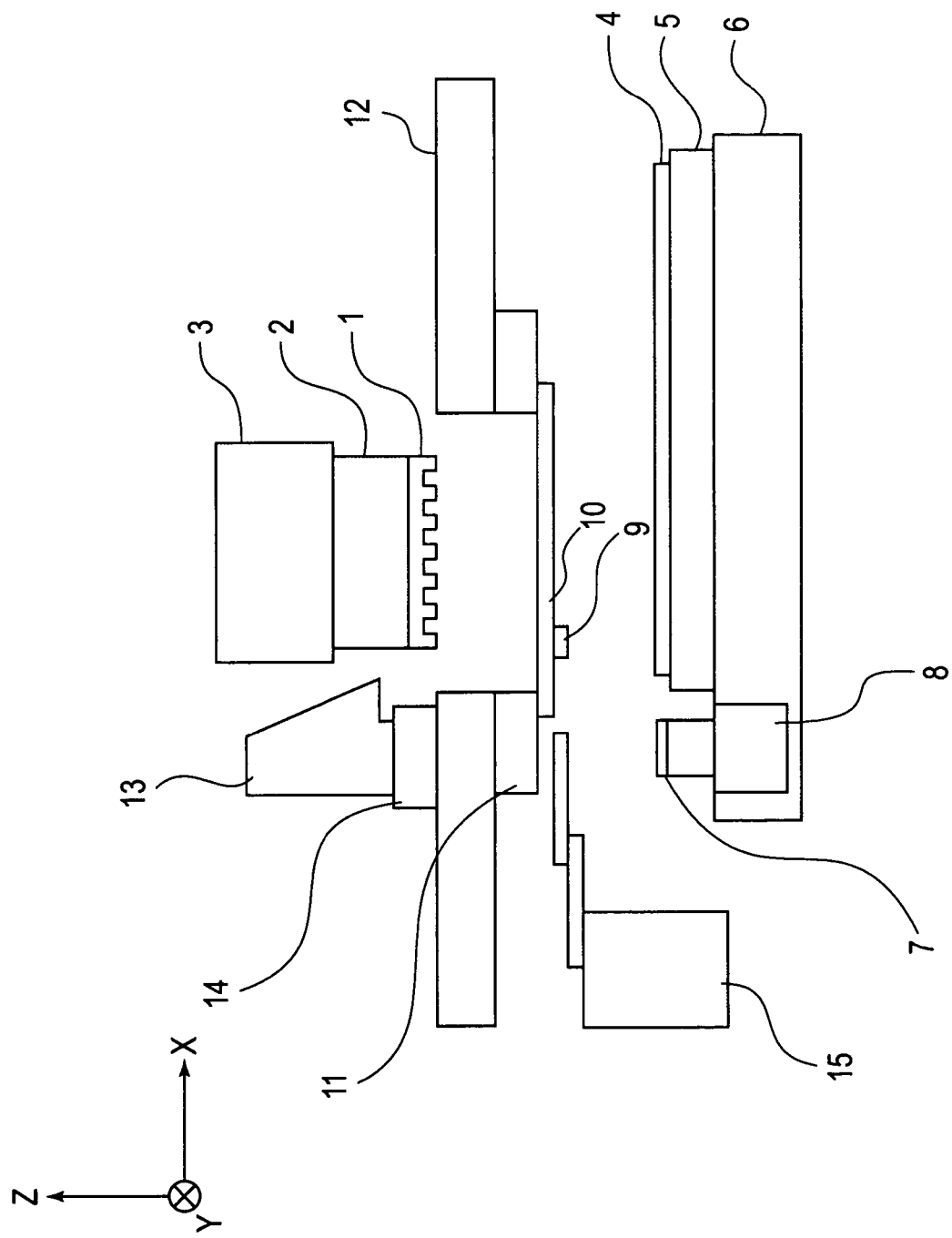
FIG. 1 is a schematic view for explaining the structure of a first embodiment of the present invention.

FIG. 1 illustrates a general structure of a microprocessing apparatus according to a first embodiment of the present invention. In FIG. 1, a mold 1 which is an original having a transfer pattern defined by surface steps (concaved and projected portions) is fixed to a mold table 2. The mold table 2 is held by a pressurizing portion 3 that functions to press the mold 1 against a workpiece substrate to which the pattern of the original is to be transferred. The pressurizing portion 3 includes driving means which serves to drive the pressurizing portion 3 to move the mold 1. While this driving means may be provided separately from the pressurizing portion, in this embodiment they are made integral.

A wafer 4, a workpiece substrate to which the pattern is to be transferred, is held by a wafer chuck 5. The wafer chuck 5 is fixed to a wafer stage 6. The wafer stage 6 is preferably made movable in six axes, that is, in X, Y and Z axes as well as in rotational axes around these axes. A reference mark table 7 functions as an initial reference of the apparatus, and it is fixed to the wafer stage 6. A first alignment scope 8 is alignment measuring means for measuring any positional deviation beyond a reference mark table, and it is mounted on the wafer stage 6.

An alignment mark 9 which serves as a reference when the mold 1 and the wafer 4 are going to be aligned with each other, is formed on an alignment substrate 10. The alignment substrate 10 is held by an alignment substrate stage 11. The alignment substrate stage 11 is fixed to a base 12, and preferably, it is made movable at least in three axes, that is, in X axis, in Y axis and around Z axis.

A second alignment scope 13 functions to measure any positional deviation between the alignment mark 9 and an alignment mark (not shown) patterned on the wafer 4, and it is mounted on an alignment stage 14. The alignment stage 14 is fixed to the base 12, and it functions so that light projected from the second alignment scope 13 is incident upon the alignment mark 9. To this end, preferably, the alignment stage 14 is made movable at least in two axial directions of X and Y axes. In FIG. 1, only one set of alignment mark 9, second alignment scope and alignment stage 14 is illustrate, but preferably, three sets or more may be used.

As regards the structure of the alignment substrate 10, it will be effective to use an element being optically transmissive such as glass, on which a diffraction grating is patterned by use of metal such as tantalum or tungsten, for example, to provide an alignment mark 9. As regards the production method for the alignment substrate 10, it will be effective to apply a resist to a glass substrate and pattern the same by use of an electron beam, for example, and then, to perform processes such as development and etching, to thereby provide a diffraction grating of tantalum. Although glass is used in this example, any material being optically transmissive such as SiC membrane or diamond membrane, for example, may be used. Also, as regards the material of the alignment mark 9, a metal such as gold, for example, may be used.

Furthermore, as regards the first and second alignment scopes 8 and 13, it will be effective to use a method that a relative positional deviation is measured on the basis of a gravity center (centroid) position of received light having been projected, diffracted and reflected.

Further, there is conveying means 15 for conveying the alignment substrate 10 for demountably mounting the same to the alignment substrate stage 11.

Next, referring to FIGS. 2–5, the sequence of alignment measuring process and transfer process in this embodiment will be described.

Figure 2:
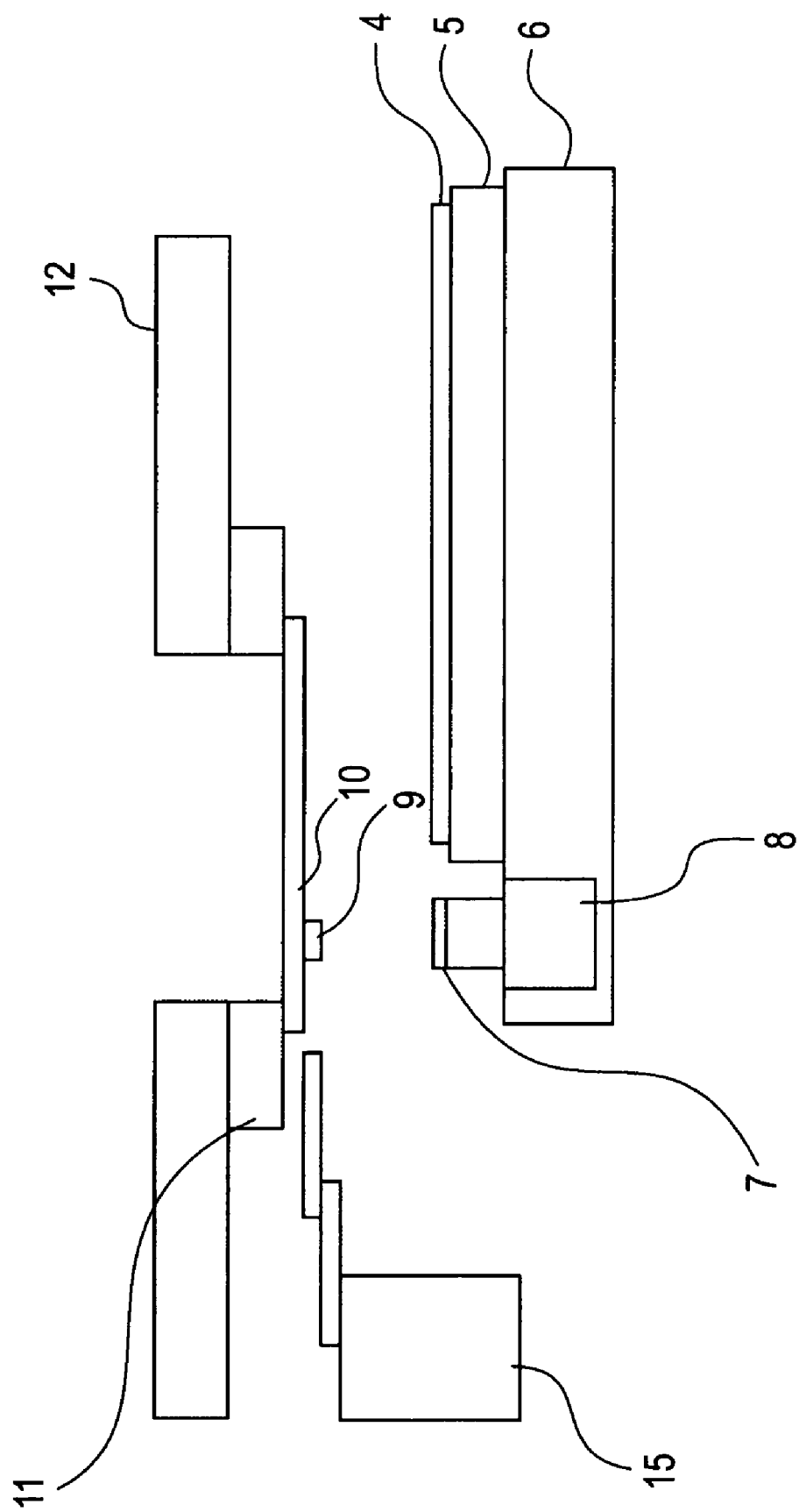
FIG. 2 is a schematic view for explaining a positioning process for an alignment substrate in the first embodiment of the present invention.

FIG. 2 illustrates a positioning step for positioning the alignment mark 9 and the alignment substrate 10 with respect to an apparatus reference. Here, the "apparatus reference" means a reference mark formed on the reference mark table 7, and it serves an origin of position measurement in the microprocessing apparatus of this embodiment.

As shown in FIG. 2, the alignment substrate 10 is conveyed by the conveying means 15, and the alignment substrate 10 is held fixed to the alignment substrate stage 11. Then, the wafer stage 6 is driven to move the reference mark table 7 to a position opposed to the alignment mark 9, namely, to assure that the alignment mark 9 comes into the observation field of the first alignment scope. Subsequently, the first alignment scope 8 measures a relative positional relationship between the reference mark formed on the reference mark table 7 and the alignment mark 9, in the X-Y plane. As regards the measuring method, it will be effective to use a method that both of the reference mark and the alignment mark 9 are formed by a diffraction grating and the relative position is measured on the basis of these diffraction gratings. Then, on the basis of the result of measurement made by the first alignment scope 8, at least one of the wafer stage 6 and the alignment substrate stage 11 is driven to remove the positional deviation of these two marks. In place of moving the stage, the relative positional relationship may be memorized for control as an offset value.

With the procedure described above, the positioning of the alignment mark 9 and the reference mark of the reference mark table 7 which is an origin of the position measurement in the microprocessing apparatus is accomplished. Thus, the position of the alignment mark 9 is taken, in the succeeding procedure, as an alignment origin.

In this embodiment, since the reference mark of the reference mark table 7 is taken as an origin for position measurement in the microprocessing apparatus, the relative positional relationship between the reference mark of the reference table 7 and the alignment mark 9 is measured by use of the first alignment scope 8. However, the origin setting for the position measurement is not limited to this. For example, the first alignment scope 8 itself may be taken as an origin of position measurement. In that occasion, without the reference mark table 7, a positional deviation of the alignment mark 9 may be measured and then the alignment mark 9 and the alignment substrate 10 may be positioned. For the measurement in such case, an interferometer or image processing through a microscope may be used, for example. As an alternative method, the alignment substrate 10 may be conveyed by using the conveying means 15 and the state in which it is held by the alignment substrate stage 11 may be taken as an origin for position measurement.

Figure 3:
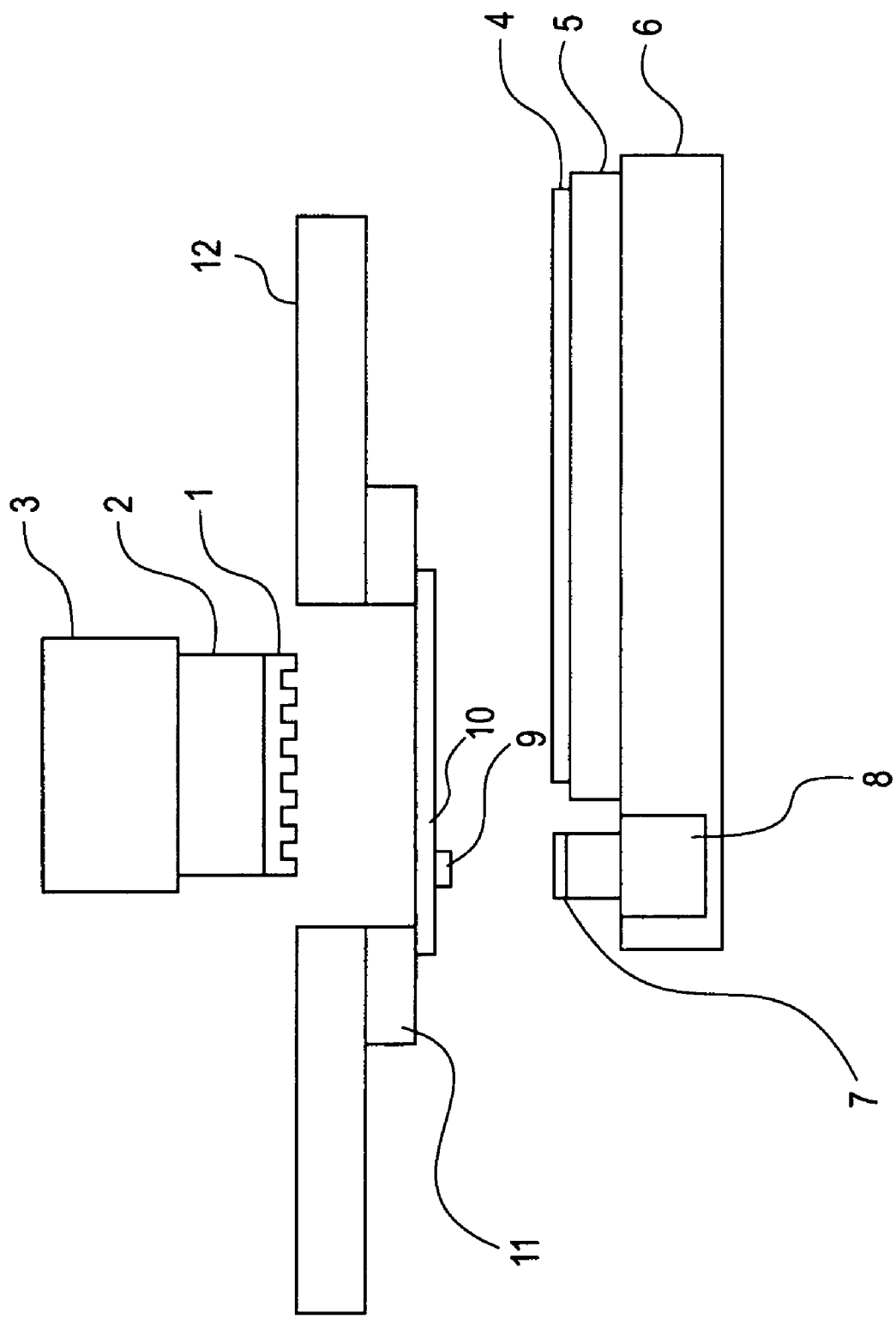
FIG. 3 is a schematic view for explaining a positioning process for a mold (original) in the first embodiment of the present invention.

FIG. 3 illustrates a positioning step for positioning the mold 1 with respect to a new origin, that is, the alignment mark 9.

As shown in FIG. 3, the mold 1 and the mold table 2 are conveyed by means of a conveying system (not shown), and then they are held by the pressurizing portion 3. Subsequently, the mold 1 is positioned with respect to the alignment mark 9 having been positioned with respect to the reference of the apparatus. At this time, the first alignment scope 8 is used to measure a positional deviation of the alignment mark 9 and the mold 1 beyond the alignment mark 9 and the alignment substrate 10. Here, it will be effective to use a method that a diffraction grating is patterned on the mold 1 as well and the alignment measurement is carried out by using the diffraction grating as a mark that represents the position of the mold 1. The diffraction grating may be a pattern defined by surface steps, like the transfer pattern of the mold 1, or alternatively, it may be patterned by use of metal such as tantalum or tungsten, for example. In the case of surface step pattern, since the alignment measurement of the wafer 4 will be carried out for the subsequent layer and layers following it, in the current layer the mark for alignment operation may be transferred to the wafer 4 and such transferred pattern may be used for the current alignment measurement.

Subsequently, on the basis of the result of measurement made by the first alignment scope 8, any relative positional deviation between the alignment mark 9 and the mark of the mold 1 is corrected, and to this end, the pressurizing portion 3 is driven to perform fine adjustment. It should be noted that this correction may be made by moving both of the wafer stage 6 and the alignment substrate stage 11.

In the procedure described above, the positioning of the mold 1 and the alignment mark 9, which is a reference position of the apparatus, is accomplished.

Figure 4:
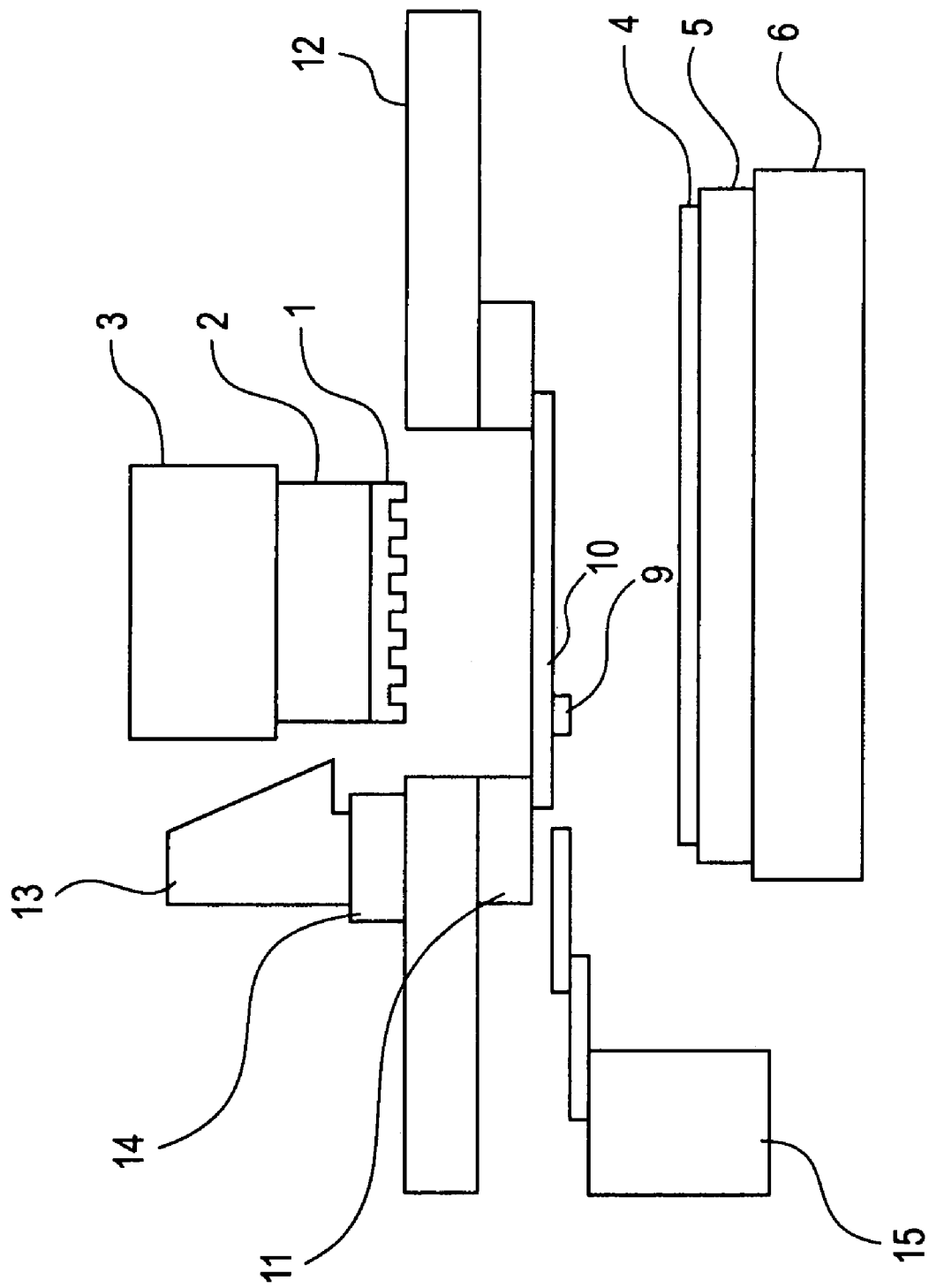
FIG. 4 is a schematic view for explaining a positioning process for a wafer (transfer surface) in the first embodiment of the present invention.

Then, in FIG. 4, the wafer 4 is positioned with respect to the apparatus reference.

For positioning the wafer 4 with respect to the apparatus reference, the second alignment scope 13 is used. The positional relationship between the optical axis of the second alignment scope 13 and the alignment mark 9 is adjusted beforehand. This can be attained by moving the alignment stage 14. However, if the positional relationship between the optical axis of the second alignment scope 13 and the alignment mark 9 is steady, the alignment operation for them is not always necessary. In that occasion, the alignment stage 14 may be omitted. Once the positional relationship between the optical axis of the second alignment scope 13 and the alignment mark 9 is corrected, then, the second alignment scope 13 measures the position of the mark patterned on the wafer 4 beyond the alignment substrate 10 and the alignment mark 9, by which the relative positional relationship between the alignment mark 9 and the wafer 4 is measured. On the basis of the result of measurement made by the second alignment scope 13, fine adjustment of the positional deviation is carried out by using the wafer stage 6.

Through the alignment process described above, the relative positional relationship of each of the mold 1 and the wafer 4 with respect to the alignment mark 9 which is the origin of position measurement can be detected. Thus, the positioning of the mold 1 and the wafer 4 is enabled.

Figure 5:
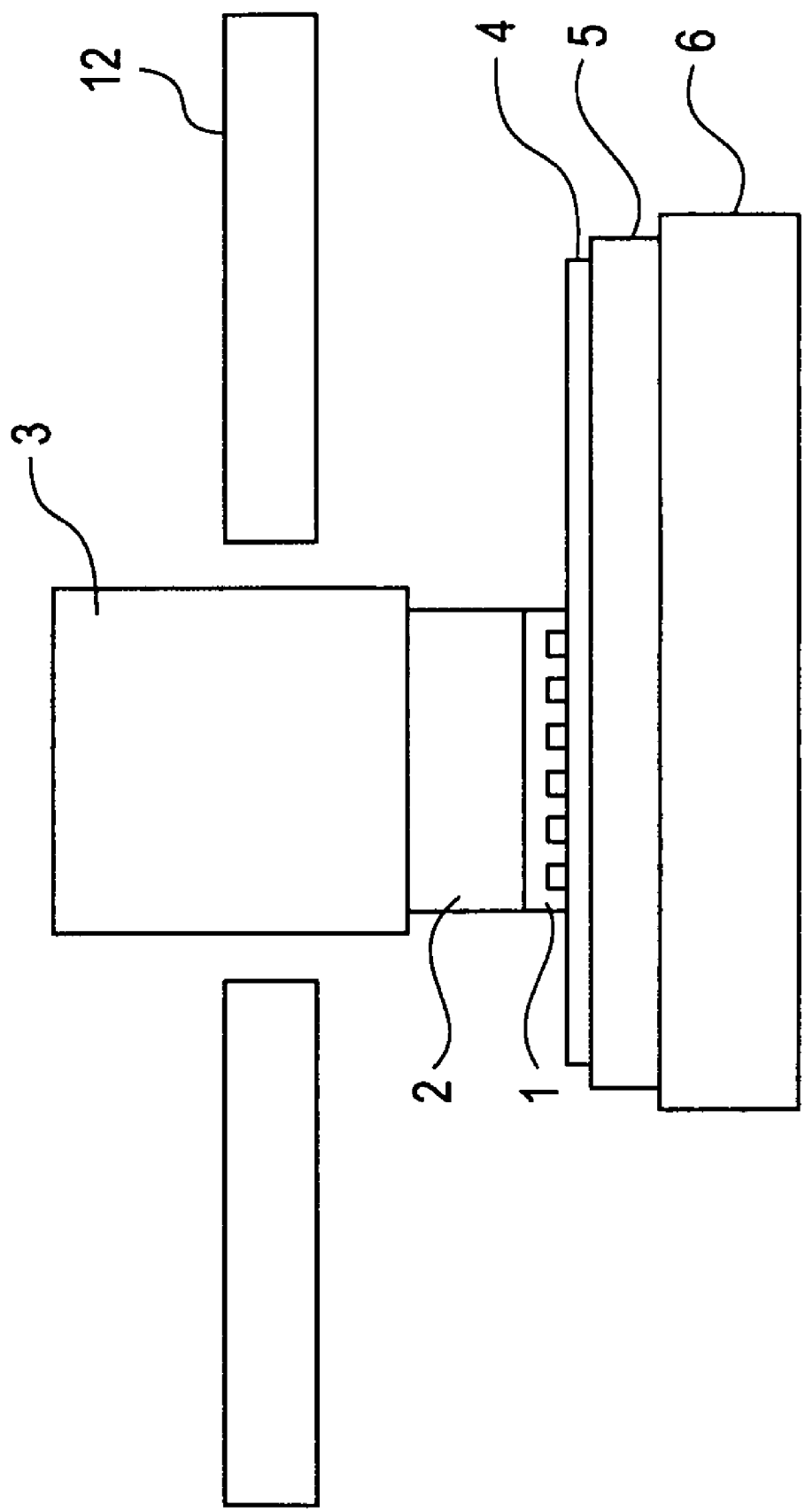
FIG. 5 is a schematic view for explaining a transfer process in the first embodiment of the present invention.

Finally, in conjunction with FIG. 5, the transfer process will be explained. After the positioning of the mold 1 and the wafer 4 is completed, the alignment substrate 10 is retracted by using the conveying means 15, and then the pressurizing portion 3 is actuated to press the mold 1 against a resist (not shown) applied to the wafer 4, whereby the pattern of the mold 1 is transferred to the resist of the wafer 4. Here, in this example, the alignment substrate 10 is retracted by the conveying means 15. If, however, the alignment substrate 10 has a membrane structure of SiC or diamond, for example, retraction of the alignment substrate 10 is unnecessary. In that occasion, even if the pattern of the mold 1 is transferred to the wafer 4 without retracting the alignment substrate 10, the pattern of the mold 1, that is, the force of surface steps, can be transmitted to the wafer 4 beyond the alignment substrate 10 and, therefore, the pattern is transferred.

After the transfer to the wafer 4 is completed, a reactive ion etching (RIE) process is carried out to complete the patterning.

The alignment process has been described above with reference to a method in which a relative positional relationship between an alignment mark 9 and a reference upon the wafer stage 6, for example, the reference mark of the reference mark table 7, is first detected and, subsequently, the mold 1 and the wafer 4 are positioned while taking the alignment mark 9 position as a position measurement origin. However, the alignment method is not limited to this. As an example, the alignment substrate 10 may be conveyed by the conveying means 15 and the position as the same is held by the apparatus may be taken as an origin. Anyway, the position of the alignment mark 9 is taken as an indirect reference, the positioning of the mold 1 and the wafer 4 is carried out.

This embodiment is based on a die-by-die alignment method in which the mold 1 and the pattern transfer region of the wafer 1 (region to which a pattern is to be transferred) are aligned with each other in one-to-one relation. However, the invention is not limited to the die-by-die alignment method. A global alignment method may be used, which is an alignment method in which a few transfer regions out of a plurality of transfer regions of a wafer are selected as sample transfer regions and, by statistically processing the positional information obtained by measuring the positions of these sample transfer regions, the positions of all the transfer regions of the wafer, including the sample transfer regions, are calculated.

If such global alignment is to be carried out, the step of positioning the alignment mark 9 with respect to the apparatus reference (FIG. 2) and the step of positioning the mold 1 with respect to the apparatus reference (FIG. 3) may be similar to those described above. In the step of positioning the wafer 4 (FIG. 4), the position of each sample transfer region on the wafer 4 may be measured by use of the second alignment scope 13. As regards the number of sample transfer regions, more than three is effective. However, the more the number, the higher the measurement precision is. Therefore, use of about eight is preferable. Then, the alignment substrate may be retracted by using the conveying means 15 and the transfer step such as shown in FIG. 5 may be carried out with respect to a predetermined shot position on the wafer 4 surface, whereby transfer in global alignment is enabled.

This embodiment has been described with reference to a microprocessing apparatus in which nano-imprint lithography is used and a pattern of an original is transferred to a workpiece substrate while the original and the workpiece substrate are brought into contact with and pressed against to each other. However, the invention is not limited to the nano-imprint lithography, but it is effectively applicable to a microprocessing apparatus in which transfer is carried out while an original and a workpiece substrate are held in contact with each other or in close proximity to each other. For example, other than the nano-imprint lithography, the invention is effectively applicable to a microprocessing apparatus based on soft contact lithography in which a pattern of an original is contacted to a workpiece substrate to be transferred thereto, or a microprocessing apparatus based on near-field lithography or line an X-ray exposure apparatus in which light, X-ray, electron beam or ion beam is projected from the back of an original thereby to transfer the pattern of the original onto a workpiece substrate.

As described above, in accordance with the first embodiment, alignment of the mold 1 and the wafer 4 can be accomplished along the transfer axis and, therefore, the overlay precision can be improved significantly. This is very effective to increases the yield of device production.

[Embodiment 2]

The first embodiment has been described with reference to an example wherein an alignment mark 9 of the alignment substrate 10 is positioned with respect to the apparatus reference and wherein the positioning of mold 1 and the wafer (workpiece substrate) 4 is carried out by using the alignment mark reference. In the second embodiment, the principle of the first embodiment is applied to off-axis alignment measurement. The second embodiment will be described below, in conjunction with FIGS. 6 and 7.

Figure 6:
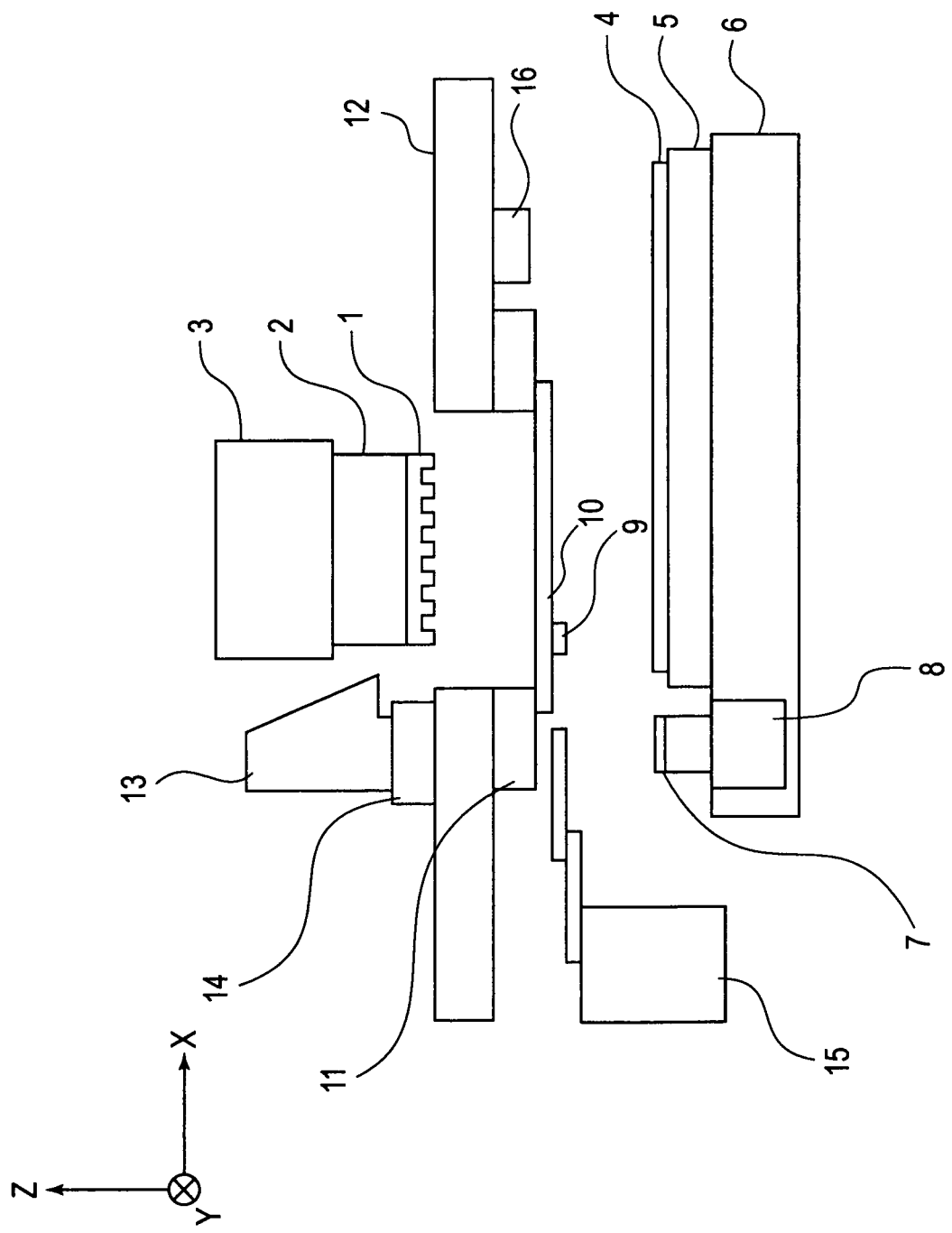
FIG. 6 is a schematic view for explaining the structure of an apparatus according to a second embodiment of the present invention.

FIG. 6 illustrates a structure of a microprocessing apparatus according to this embodiment of the present invention. In FIG. 6, a mold 1 which is an original having a transfer pattern defined by surface steps (concaved and projected portions) is fixed to a mold table 2. The mold table 2 is held by a pressurizing portion 3 that functions to press the mold 1 against a workpiece substrate to which the pattern of the original is to be transferred. The pressurizing portion 3 functions also as driving means for performing fine adjustment of the position of the mold 1.

A wafer 4, a workpiece substrate to which the pattern is to be transferred, is held by a wafer chuck 5. The wafer chuck 5 is fixed to a wafer stage 6. The wafer stage 6 is preferably made movable in six axes, that is, in X, Y and Z axes as well as in rotational axes around these axes. A reference mark table 7 functions as an initial reference of the apparatus, and it is fixed to the wafer stage 6. A first alignment scope 8 is alignment measuring means for measuring any positional deviation beyond a reference mark table, and it is mounted on the wafer stage 6.

An alignment mark 9 which serves as a reference when the mold 1 and the wafer 4 are going to be aligned with each other, is formed on an alignment substrate 10. The alignment substrate 10 is held by an alignment substrate stage 11. The alignment substrate stage 11 is fixed to a base 12, and preferably, it is made movable at least in three axes, that is, in X axis, in Y axis and around Z axis.

A second alignment scope 13 functions to measure any positional deviation between the alignment mark 9 and an alignment mark (not shown) patterned on the wafer 4, and it is mounted on an alignment stage 14. The alignment stage 14 is fixed to the base 12, and it functions so that light projected from the second alignment scope 13 is incident upon the alignment mark 9. To this end, preferably, the alignment stage 14 is made movable at least in two axial directions of X and Y axes. In FIG. 6, only one set of alignment mark 9, second alignment scope 13 and alignment stage 14 is illustrate, but preferably, three sets or more may be used.

As regards the structure of the alignment substrate 10, it will be effective to use an element being optically transmissive such as glass, on which a diffraction grating is patterned by use of metal such as tantalum or tungsten, for example, to provide an alignment mark 9. As regards the production method for the alignment substrate 10, it will be effective to apply a resist to a glass substrate and pattern the same by use of an electron beam, for example, and then, to perform processes such as development and etching, to thereby provide a diffraction grating of tantalum. Although glass is used in this example, any material being optically transmissive such as SiC membrane or diamond membrane, for example, may be used. Also, as regards the material of the alignment mark 9, a metal such as gold, for example, may be used.

Furthermore, as regards the first and second alignment scopes 8 and 13, it will be effective to use a method that a relative positional deviation is measured on the basis of a gravity center (centroid) position of received light having been projected, diffracted and reflected.

Further, there is conveying means 15 for conveying the alignment substrate 10 for demountably mounting the same to the alignment substrate stage 11.

An off-axis scope 16 is mounted at a position away from the transfer axis along which the mold 1 and the wafer 4 are disposed opposed to each other and then contacted to each other. In FIG. 6, the off-axis scope is mounted on the base 12. However, this is not a requisition and it may be disposed at any position such as on the alignment substrate stage 11, for example, where it can measure the wafer 4 and the reference mark table 7 approximately in parallel to the transfer axis. Further, as regards the off-axis scope 16, a measuring method which is based on image processing using a microscope may be effectively used. As shown in FIG. 6, use of a single unit of off-axis scope is sufficient.

In ordinary alignment measurement, the mold 1 is positioned and, by measuring an alignment mark on the wafer 4 through the off-axis scope 16, a positional deviation of the wafer 4 can be corrected. The positioning of the mold 1 may conveniently be carried out by using the same technique described in the first embodiment with reference to FIG. 3. Further, as regards the alignment measurement using the off-axis scope, the global alignment method is effective to do it, and before disposing the mold 1 and the wafer 4 opposed to each other, alignment measurement is carried out in relation to plural transfer regions (sample transfer regions). As regards the number of sample transfer regions, more than three is effective. However, the more the number, the higher the measurement precision is. Therefore, use of about eight is preferable.

With only the procedure described above, however, the positional relationship between the transfer axis of the mold 1 and the wafer 4 and the alignment measurement axis of the off-axis scope 16 is unknown. Therefore, even by improving the alignment measurement precision of the off-axis scope 16 singly, it is unable to correct a positional deviation between the mold 1 and the wafer 4. Thus, it is necessary to correct the baseline which represents the positional relationship between the transfer axis and the alignment measurement axis of the off-axis scope 16. Here, referring to FIG. 7, a method of correcting the baseline while taking an alignment mark 9 patterned on the alignment substrate 10 as a reference, will be explained.

Initially, before baseline correction, a process is carried out to position the alignment mark 9 and the alignment substrate 1 and the thus determined position is taken as a new reference. This procedure has been explained in the first embodiment with reference to FIG. 2. Here, it will be described briefly.

First of all, the alignment substrate 10 is conveyed by the conveying means 15, and the wafer stage 6 is driven to move the reference mark table 7 to a position opposed to the alignment mark 9. Subsequently, the first alignment scope 8 measures a relative positional relationship between the reference mark table 7 and the alignment mark 9 beyond the reference mark table 7. Then, on the basis of the result of measurement made by the first alignment scope 8, at least one of the wafer stage 6 and the alignment substrate stage 11 is used to perform fine adjustment, for correction of the positional deviation between them.

With this procedure, the positioning of the reference mark table 7 which is an initial apparatus reference and the alignment mark 9 is accomplished. Thus, subsequently, the position of the alignment mark 9 and the alignment substrate 10 is taken as an apparatus reference.

Figure 7:
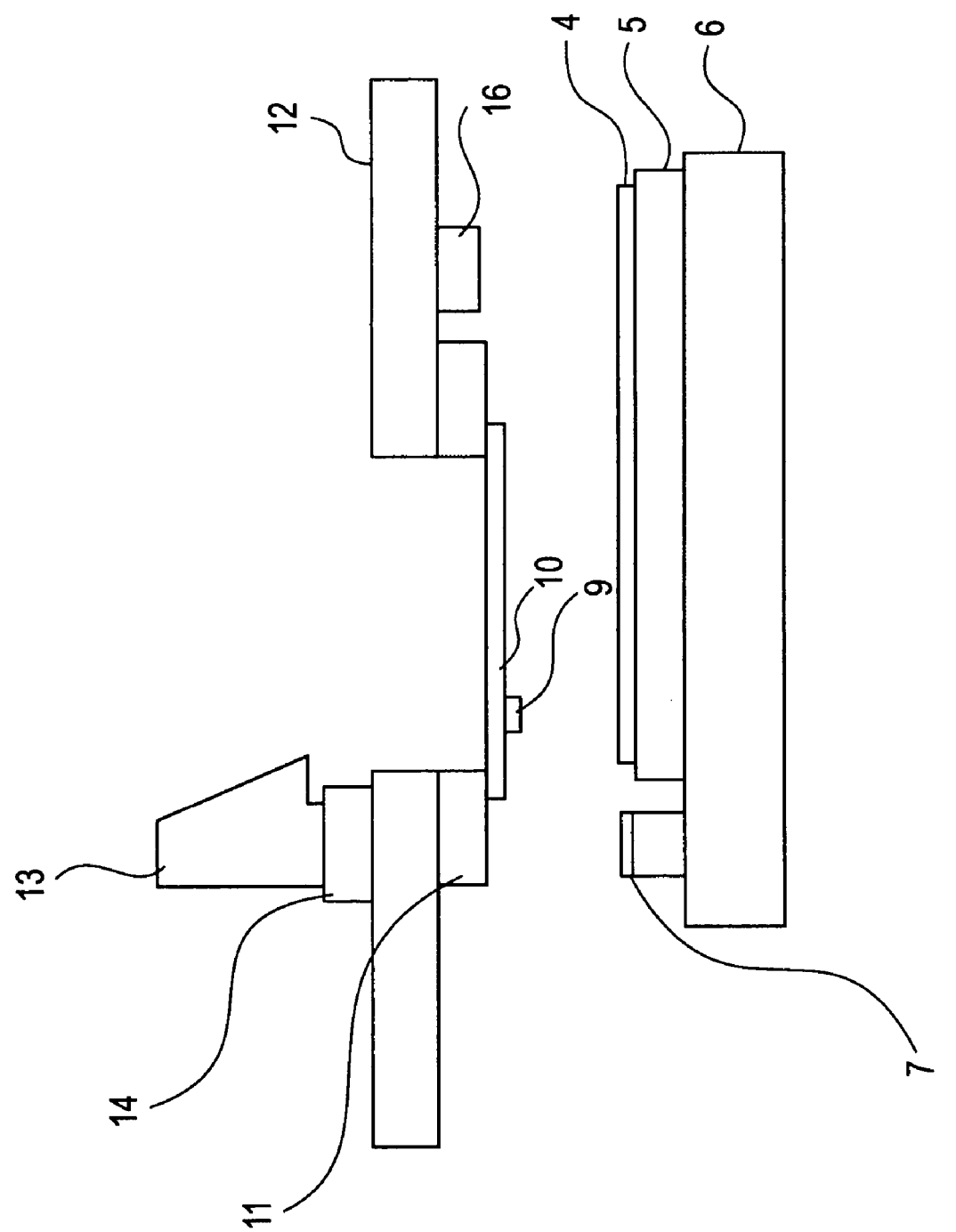
FIG. 7 is a schematic view for explaining a base line correction process in the second embodiment of the present invention.

FIG. 7 illustrates the process of baseline correction.

By using the second alignment scope 13, at least one of the alignment mark on the wafer 4 and the reference mark table 7 is measured, beyond the alignment mark 9 newly established as an apparatus reference, and any positional deviation with respect to the alignment mark 9 is then corrected. Subsequently, at least one of the alignment mark on the wafer 4 and the reference mark table 7, having been measured by the second alignment scope, is measured by means of the off-axis scope 16. By correcting a positional deviation of the wafer 4 and/or of the reference mark table 7 thus measured, the baseline correction is accomplished. Before the baseline correcting step, it is necessary to adjust the positional relationship between the optical axis of the alignment light from the second alignment scope 13 and the alignment mark 9 on the alignment substrate 10. However, since such process has been described in the first embodiment with reference to FIG. 4, description is omitted here.

Subsequently, as regards the mold 1, like the technique having been described in the first embodiment, any positional deviation is measured by means of the first alignment scope 8, and fine adjustment is carried out by means of the pressurizing portion 3. Alternatively, the fine adjustment may be made by use of the wafer stage 6 and the alignment substrate stage 11. As regards the alignment measurement for the wafer 4, any positional deviation is measured by means of the off-axis scope, and then it is positioned by use of the wafer stage 6. Thereafter, the pressuring portion 3 is actuated to press the mold 1 against a resist (not shown) applied to the wafer 4, such that the pattern of the mold 1 is transferred to the resist on the wafer 4. Finally, after the transfer to the wafer 4 is completed, a reactive ion etching (RIE) process is carried out to complete the patterning.

This embodiment has been described with reference to a microprocessing apparatus in which nano-imprint lithography is used and a pattern of an original is transferred to a workpiece substrate while the original and the workpiece substrate are brought into contact with and pressed against to each other. However, the invention is not limited to the nano-imprint lithography, but it is effectively applicable to a microprocessing apparatus in which transfer is carried out while an original and a workpiece substrate are held in contact with each other or in close proximity to each other. For example, other than the nano-imprint lithography, the invention is effectively applicable to a microprocessing apparatus based on soft contact lithography in which a pattern of an original is contacted to a workpiece substrate to be transferred thereto, or a microprocessing apparatus based on near-field lithography or line an X-ray exposure apparatus in which light, X-ray, electron beam or ion beam is projected from the back of an original thereby to transfer the pattern of the original onto a workpiece substrate.

As described above, in accordance with the second embodiment of the present invention, alignment of a workpiece substrate can be accomplished on the basis of off-axis arrangement. The throughput can therefore be improved significantly.

[Embodiment 3]

Figure 8:
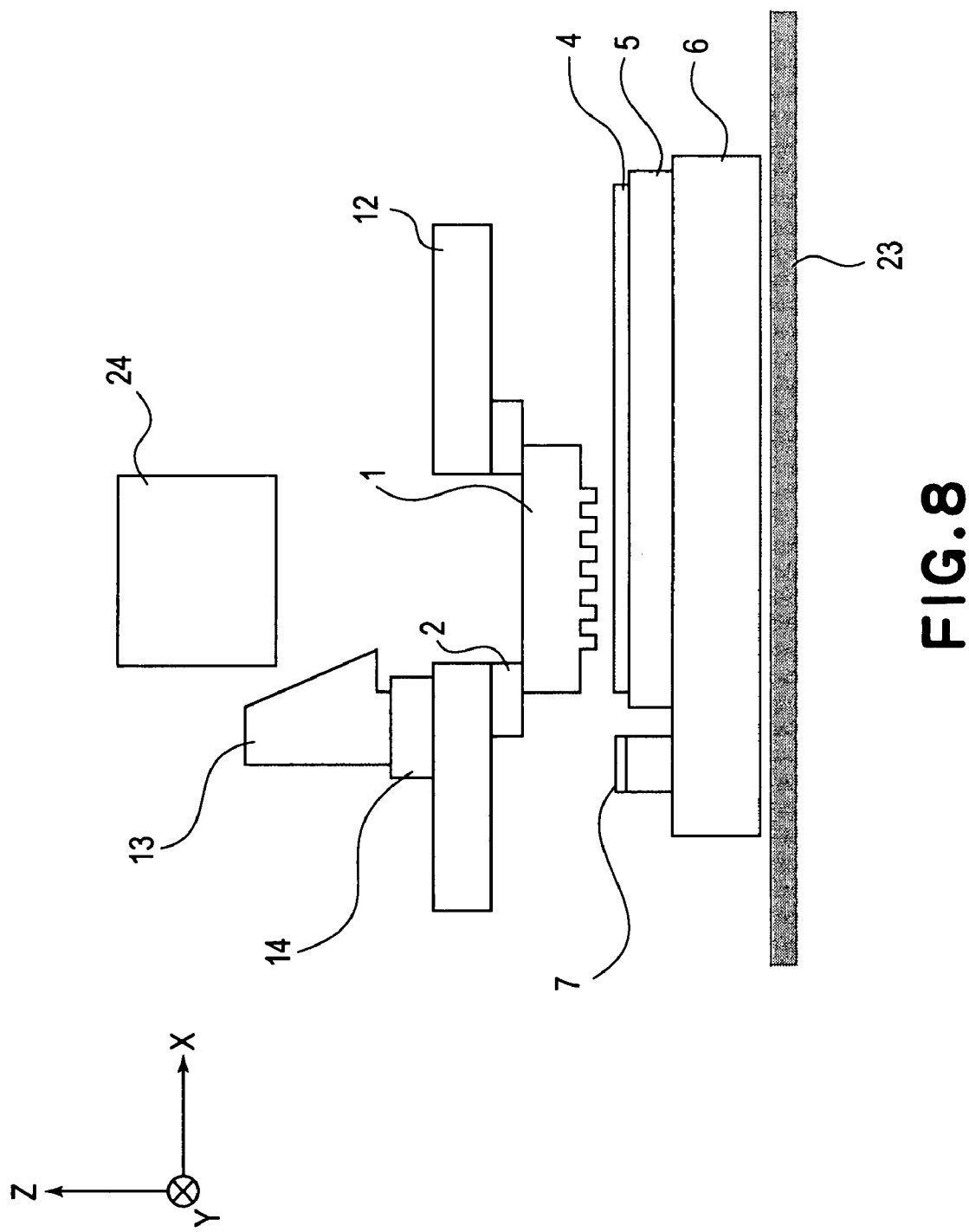
FIG. 8 is a schematic view for explaining the structure of an apparatus according to a third embodiment of the present invention.

FIG. 8 illustrates a general structure of a microprocessing apparatus according to a third embodiment of the present invention. In FIG. 8, a template 1 which is an original having a transfer pattern defined by surface steps is held by an original stage 2. The template 1 is made of a material such as quartz or fluorite, for example, having a transmissivity to ultraviolet rays. The original stage 2 serves to position the template 1 with respect to an apparatus reference. The original stage 2 needs at least a driving axis (θ) about Z axis, but preferably it should have movement axes also in Z axis, around X axis (ωy) and around Y axis (ωx). The original stage 2 is provided with positioning sensors for measuring the positions with respect to these driving axes, although they are not shown in the drawing.

A base 12 is fixed to a main base table (not shown), and it holds the original stage 2 and the alignment stage 14. The alignment stage 14 holds the second alignment scope 13, and moves the same so that the second alignment scope 13 catch an alignment mark on the template 1. The second alignment scope 13 has a function for measuring the amount of positional deviation of the template 1 from the apparatus reference and also for measuring a relative positional deviation between the template 1 and a wafer (workpiece substrate) 4. As regards the measuring method, it will be effective to use a method in which, while using a diffracting grating as an alignment mark, alignment marks are formed on the template 1 and the wafer 4, and light is projected to the alignment marks, and a relative positional deviation is measured on the basis of a gravity center (centroid) position of light diffracted and reflected and came back to the second alignment scope 13. The wafer 4 is held by a wafer chuck 5, and the wafer chuck 5 is fixed to a wafer stage 6. A resist is applied to the wafer 4 by spin coating, and an etch barrier which consists of an organic substance having low viscosity coefficient is applied to the transfer position thereon. Preferably, the wafer stage 6 is movable in total six-axis directions, that is, X, Y, Z, ωx, ωy and θ. In the X and Y directions, the wafer stage 6 is driven by linear motors, while floating the same from a stage base table 23 by means of compressed airs. The wafer stage 6 is provided with positioning sensors such as laser interferometers, for example, for measuring the positions with respect to these driving axes, although they are not shown in the drawing.

Fixedly mounted on the wafer stage 6 is a reference mark table 7 which serves as an apparatus reference. The reference mark table 7 as well has an alignment mark of diffraction grating, formed thereon. There is an UV light source 24 for sensitizing the etching barrier applied to the transfer position on the wafer 4 surface beyond the template 1, the light source being fixed to the main base table (not shown).

In FIG. 8, only a single set of alignment stage 14 and second alignment scope 13 is illustrated. Actually, however, there are three sets or more. In this connection, there are alignment marks patterned at three or more locations upon the template 1, and there are alignment marks at three or more locations in each transfer shot of the wafer 4. For convenience of illustration of the apparatus structure, only one set is illustrated in the succeeding drawings.

Figure 9:
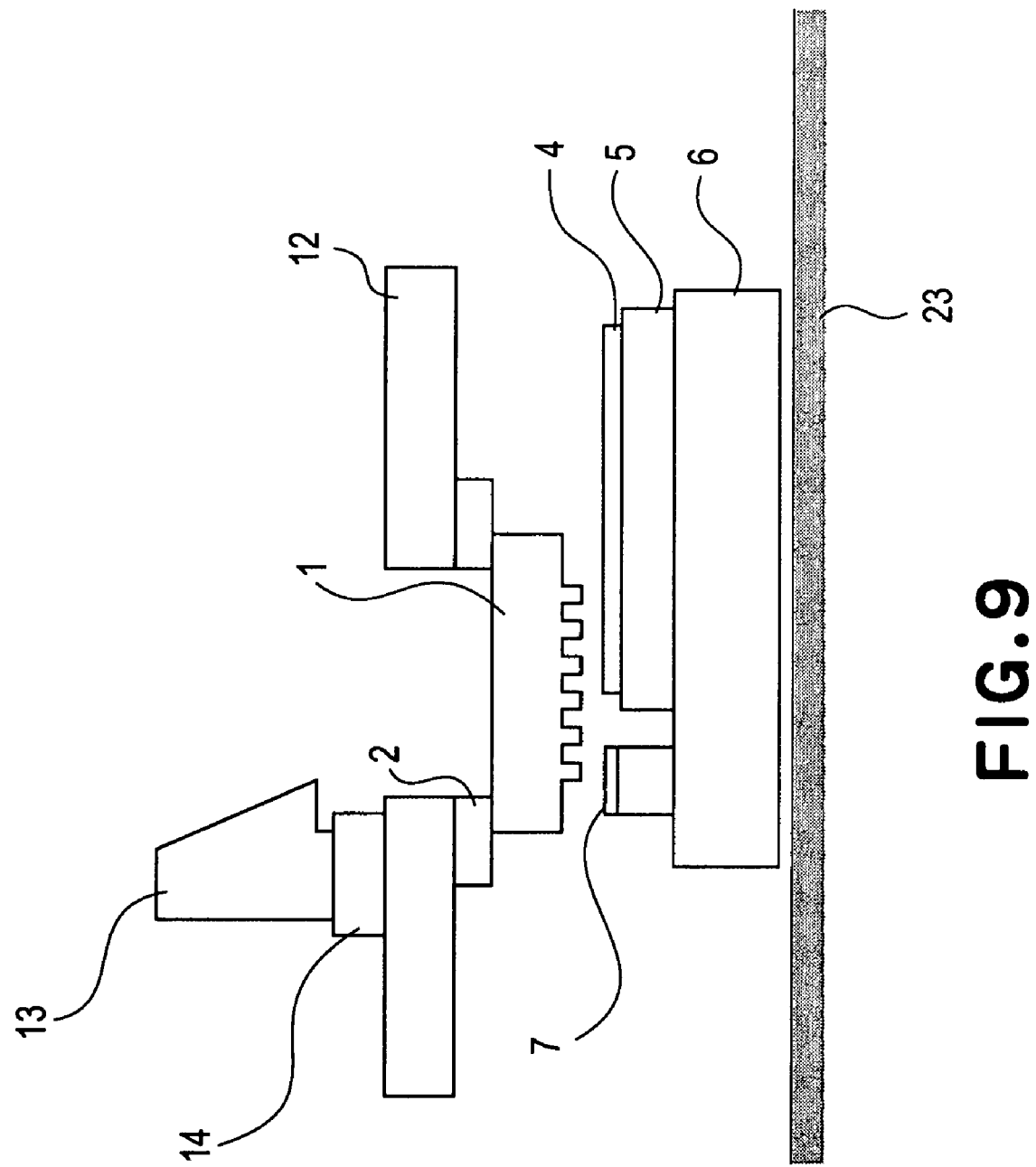
FIG. 9 is a schematic view for explaining a process for positioning a template with respect to an apparatus reference, in the third embodiment of the present invention.
Figure 10:
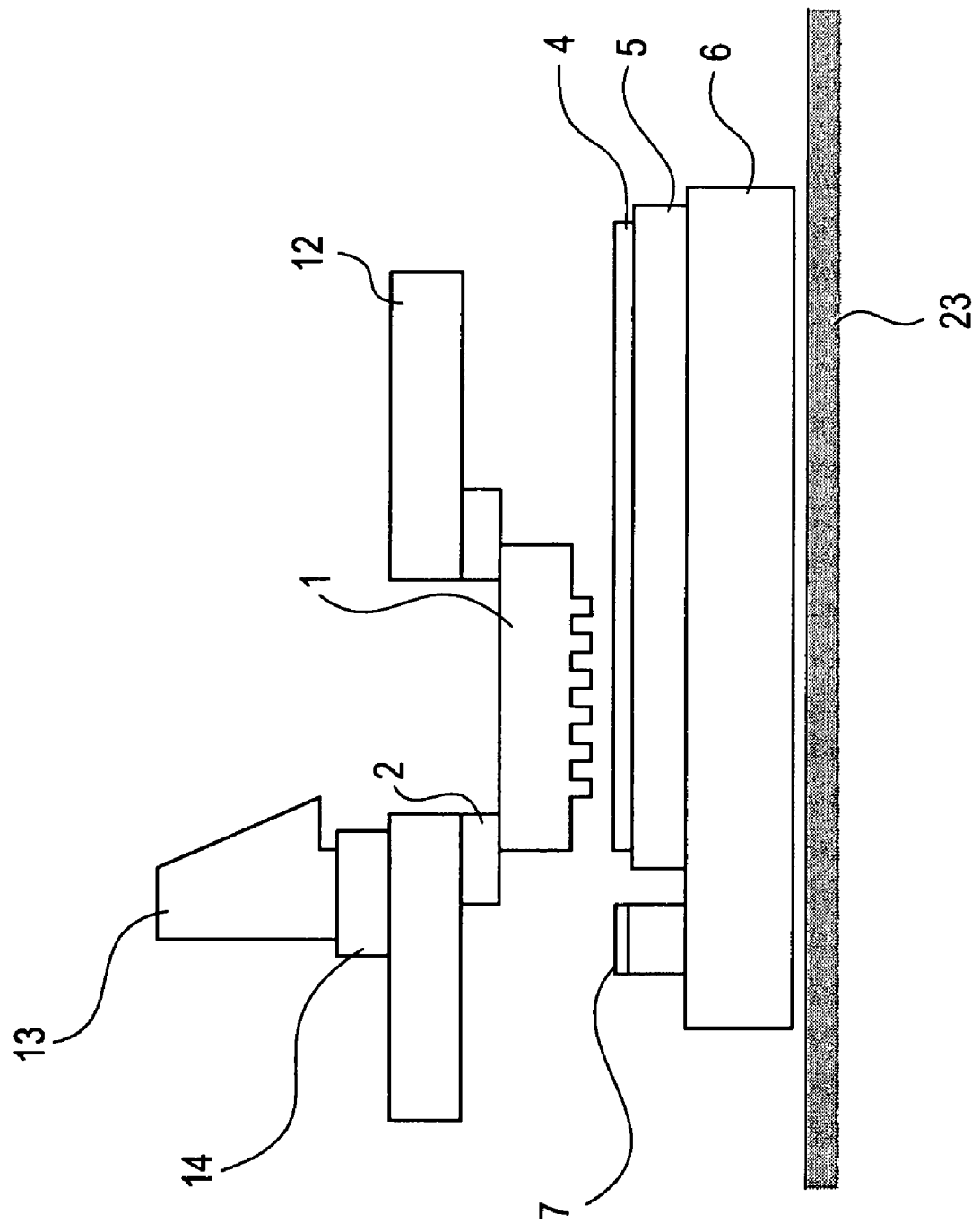
FIG. 10 is a schematic view for explaining a wafer alignment measuring process in the third embodiment of the present invention.
Figure 11:
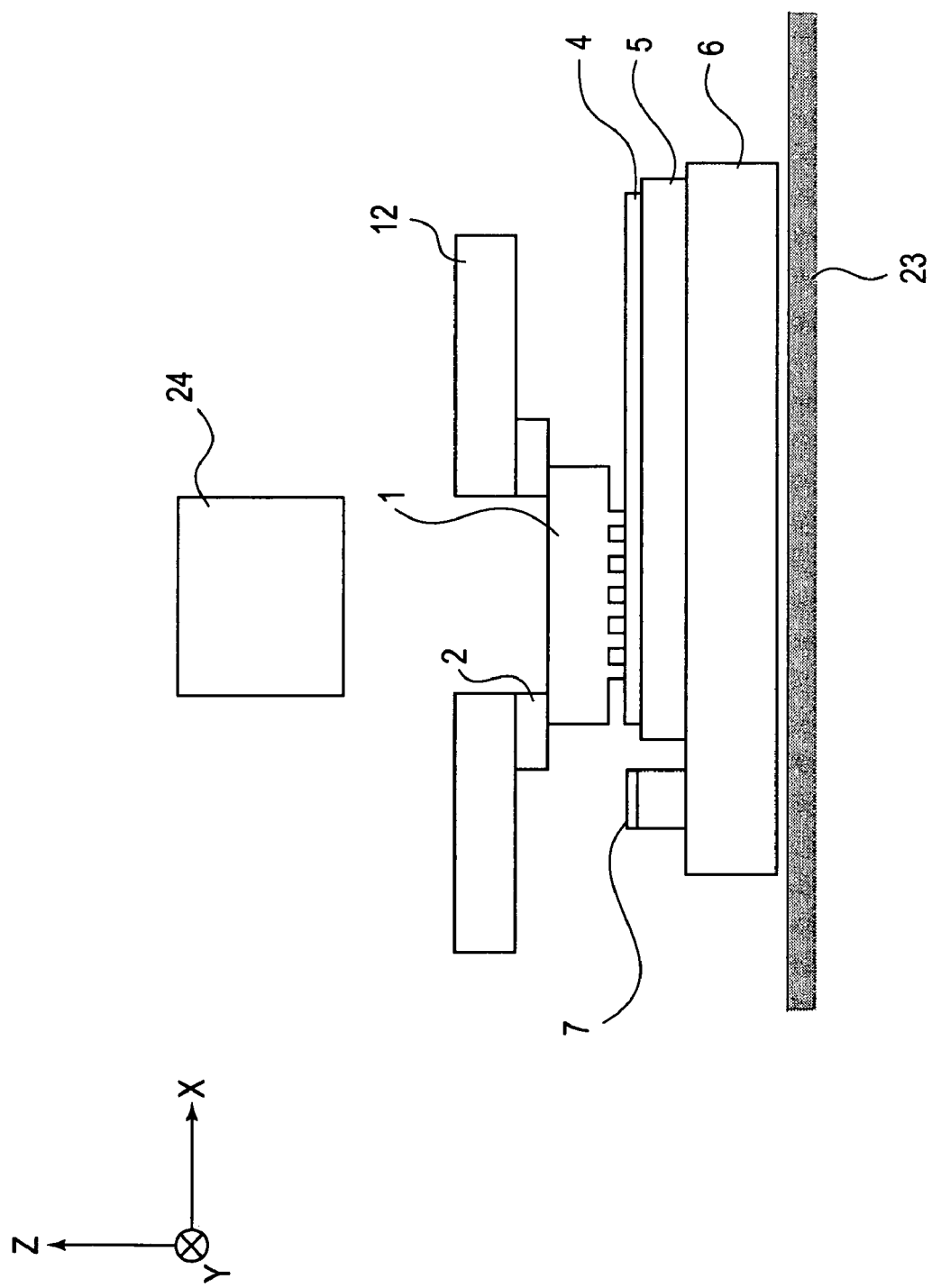
FIG. 11 is a schematic view for explaining a transfer process in the third embodiment of the present invention.

Referring now to FIGS. 9–11, the procedure of alignment measurement and correction and transfer in the present embodiment will be described.

FIG. 9 illustrates the process for positioning the template 1 with respect to the apparatus reference. Initially, the wafer stage 6 is moved to a position whereat the alignment mark of the template 1 and the alignment mark of the reference mark table 7 are opposed to each other. Subsequently, the alignment stage 14 is driven so that the second alignment scope 13 hunts the alignment mark on the template 1. Then, beyond the template 1, a positional deviation between the template 1 and the reference table 7 is measured. On the basis of the thus measured positional deviation amount with respect to the reference mark table 7, that is, a positional deviation amount with respect to the apparatus reference, the original stage 2 is moved to correct the deviation. When this is accomplished, the template is positioned with respect to the apparatus reference.

FIG. 10 illustrates the process of alignment measurement for the wafer. By use of second alignment scope 13, the spacing (gap) between the template 1 and the wafer 4 is measured beyond the template 1, and a gap for alignment measurement (for example, 30 μm) is set. The motion for the gap setting is performed by at least one of the original stage 2 and the wafer stage 6. Then, the second alignment scope 13 is used to measure the alignment mark on the template 1 and the alignment mark on the wafer 4, beyond the template 1, and a relative positional deviation between the template 1 and the wafer 4 is detected. Here, although the die-by-die alignment method in which the alignment measurement is carried out in relation to each shot position may be used, use of the global alignment method is preferable.

FIG. 11 illustrates a transfer process. The transfer position on the wafer 4 should be placed to be opposed to the template 1. Here, since the template 1 has already been positioned with respect to the apparatus reference, the transfer position of the wafer 4 is adjusted with respect to the template 1 on the basis of the result of alignment measurement. Then, at least one of the original stage 2 and the wafer stage 6 is moved in Z-axis direction, whereby the template 1 and the transfer position of the wafer 4 are brought into contact with each other. Ultraviolet rays are then projected from the UV light source 24, to thereby sensitize the etch barrier and the resist on the wafer 4.

Finally, the original and the wafer 4 are disengaged from each other, and a reactive ion etching (RIE) process is carried out, whereby the patterning is completed.

Figure 12:
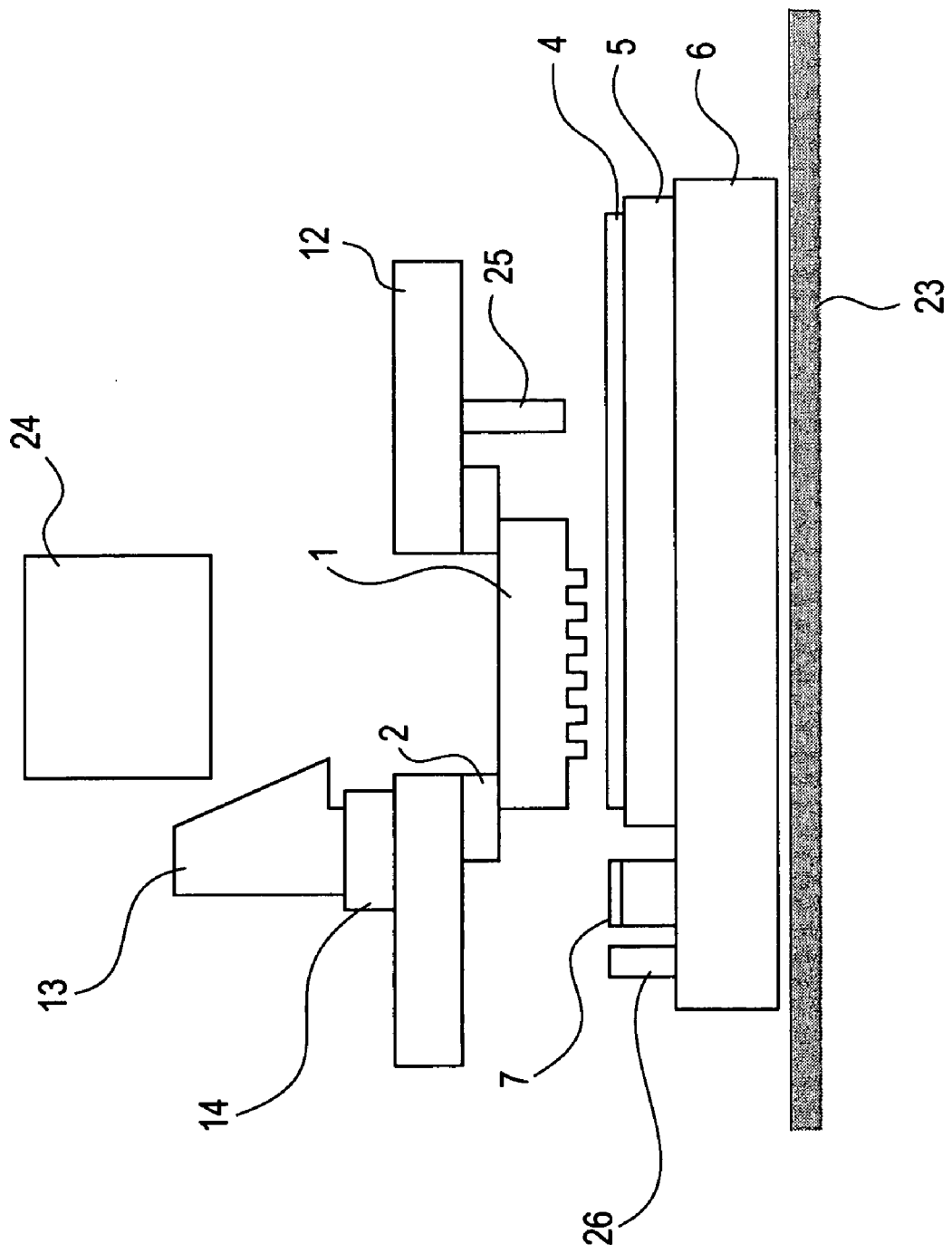
FIG. 12 is a schematic view for explaining a gap measuring method in the third embodiment of the present invention.

The gap setting for the alignment measurement in this example is based on measuring the gap by means of the second alignment scope. However, the invention is not limited to this. For example, as shown in FIG. 12, the base 12 may be provided with a wafer height sensor 25 while the wafer stage 6 may be provided with an original height sensor 26, such that the gap measurement and gap setting may be carried out by measuring the heights by use of these sensors. The wafer height sensor 25 and the original height sensor 26 may preferably use an optical measuring method, but the wafer height sensor 25 may use an electrostatic capacitance method. In the case of such apparatus structure, for positioning of the template 1 with respect to the apparatus reference, the level of the template 1 may be measured beforehand by means of the original height sensor 26 and, after setting the template 1 at a predetermined level, the wafer stage 6 may be moved to a position whereat the alignment mark of the template 1 and the reference mark table 7 are opposed to each other. For wafer alignment measurement, at plural measurement points the level of the wafer 4 may be measured beforehand to determine the height for gap setting at each shot. Alternatively, after the template 1 and the wafer 4 are opposed to each other, the height may be measured real-time and control may be made to hold a constant gap.

This embodiment has been described with reference to a microprocessing apparatus in which step-and-flash imprint lithography is used and a pattern of an original is transferred to a workpiece substrate while the original and the workpiece substrate are brought into contact with each other. However, the invention is not limited to the step-and-flash imprint lithography, but it is effectively applicable to a microprocessing apparatus in which transfer is carried out while an original and a workpiece substrate are held in contact with each other or in close proximity to each other. For example, other than the step-and-flash imprint lithography, the invention is effectively applicable to a microprocessing apparatus based on nano-imprint lithography in which an original and a workpiece substrate are pressed against to each other, soft contact lithography in which a pattern of an original is contacted to a workpiece substrate, or a microprocessing apparatus based on near-field lithography or line an X-ray exposure apparatus in which light, X-ray, electron beam or ion beam is projected from the back of an original thereby to transfer the pattern of the original onto a workpiece substrate.

[Embodiment 4]

A fourth embodiment of the present invention will be described with reference to a template as an original for doing alignment measurement.

Figure 13A:
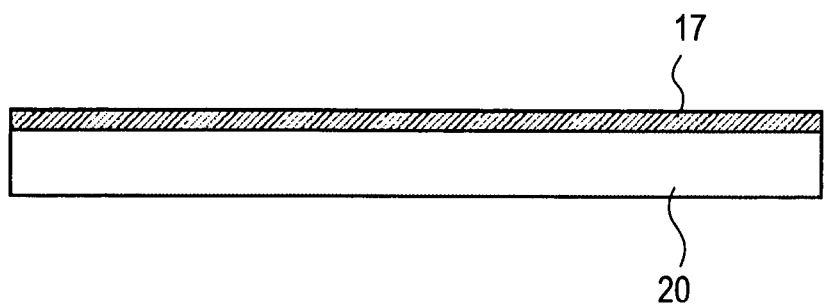
FIGS. 13A–13C are schematic views for explaining a template manufacturing method in a fourth embodiment of the present invention.
Figure 13B:
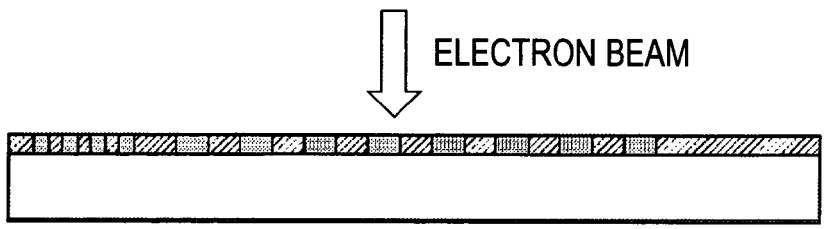
Figure 13C:
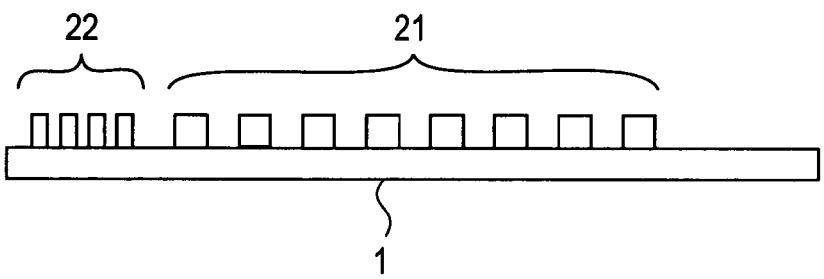
Figure 14A:
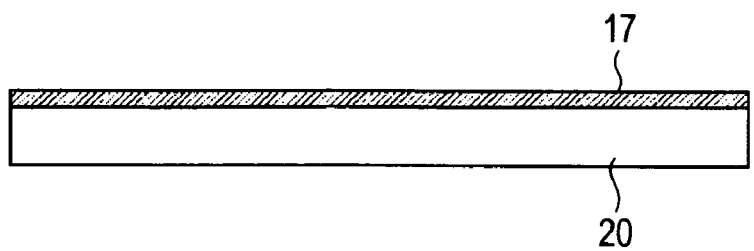
FIGS. 14A–14G are schematic views for explaining a template manufacturing method in the fourth embodiment of the present invention.
Figure 14B:
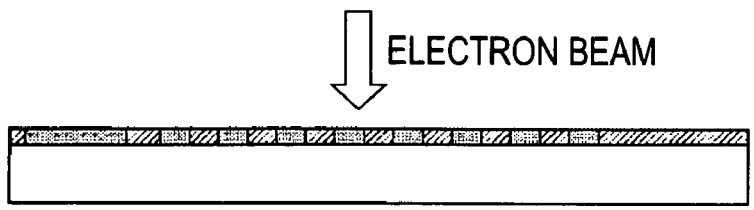
Figure 14C:
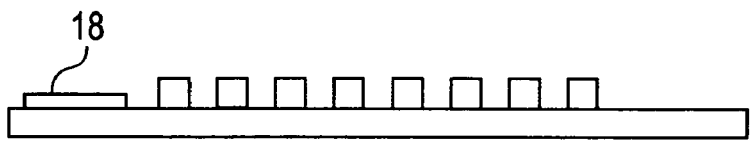
Figure 14D:
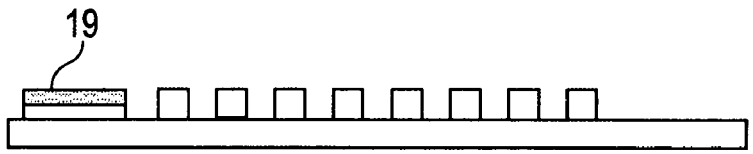
Figure 14E:
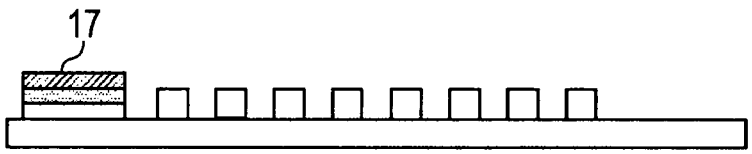
Figure 14F:
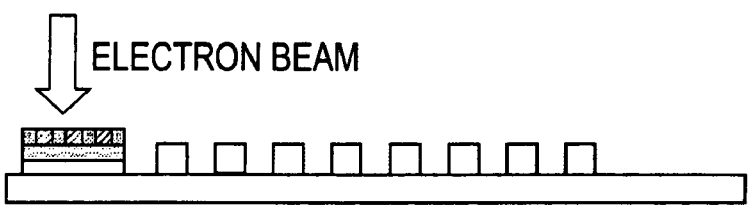
Figure 14G:
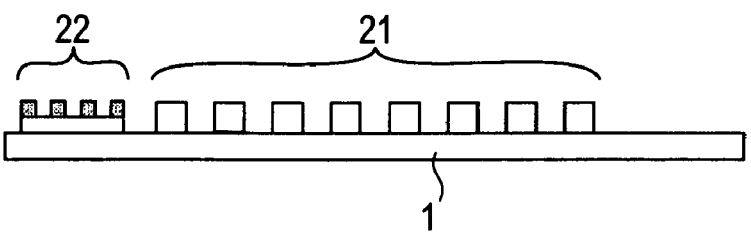
Figure 15A:
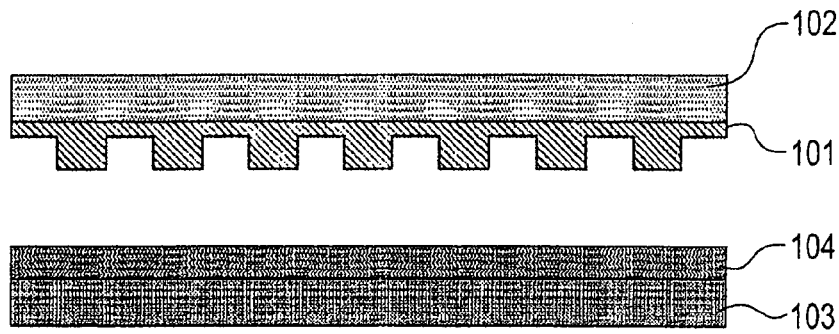
FIGS. 15A–15D are schematic view for explaining nano-imprint technology.
Figure 15B:
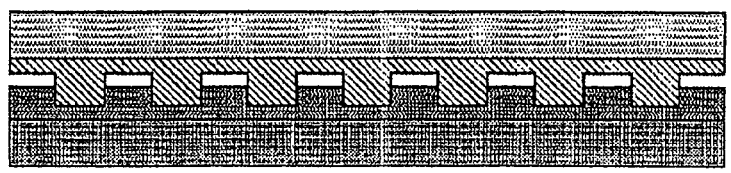
Figure 15C:
Figure 15D:
Figure 16A:
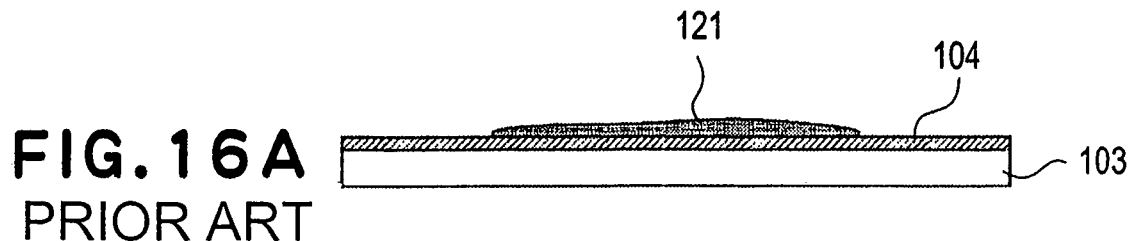
FIGS. 16A–16E are schematic views for explaining step-and-flash imprint lithography.
Figure 16B:
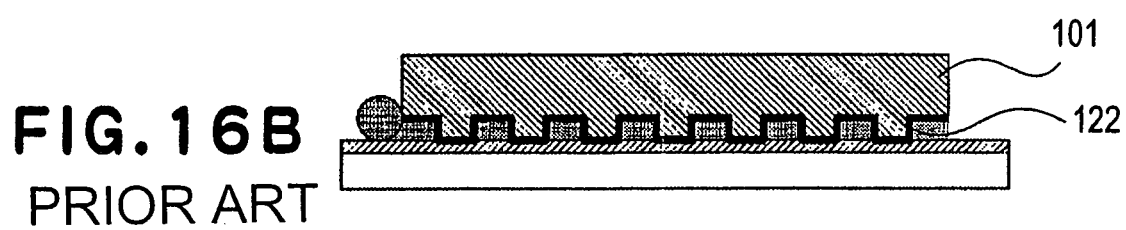
Figure 16C:
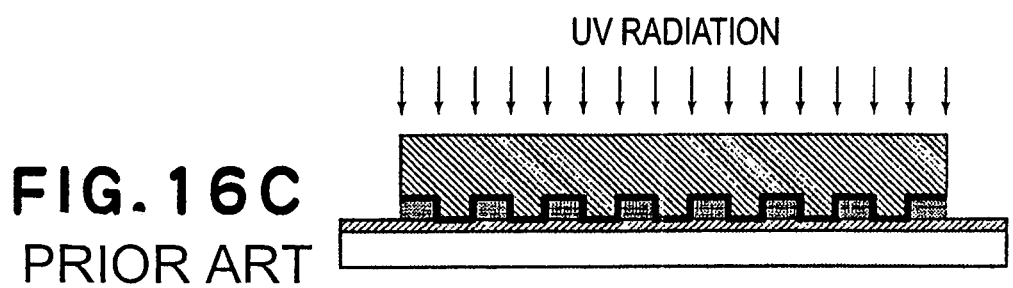
Figure 16D:
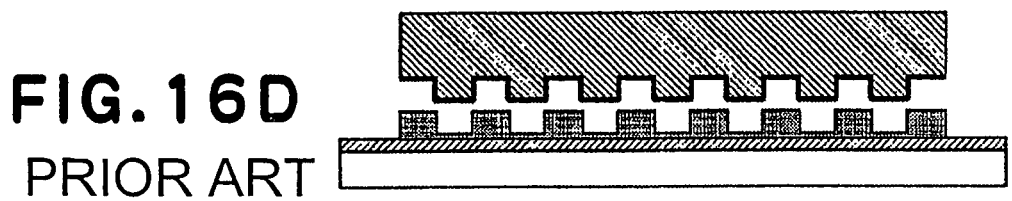
Figure 16E:
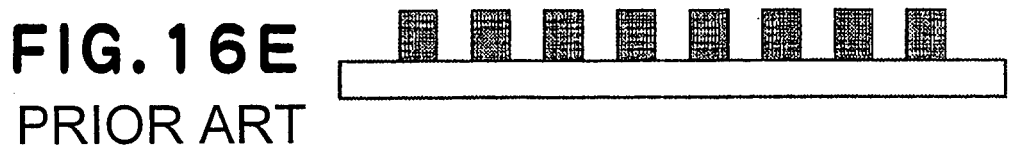

As best seen in FIG. 13C or FIG. 14G, the template 1 has a pattern portion 21 defined by surface steps and an alignment mark 22. The alignment mark 22 may be provided by a mark defined by surface steps like the pattern portion 21, or alternatively, preferably it may be separately defined by a mark formed by a metal such as tantalum or tungsten, for example.

If the alignment mark 22 comprises a mark defined by surface steps like the pattern portion 21 as shown in FIG. 13, then a resist 17 is applied to a glass substrate 20 of quartz, for example (FIG. 13A), an electron beam is used to draw a desired pattern thereon (FIG. 13B), and then development and etching processes are carried out (FIG. 13C). By doing so, not only the pattern portion 21 but also the alignment mark 22 can be patterned. At the transfer process, like the pattern portion 21, also the alignment mark 22 is transferred to the etching barrier and the resist on the wafer, such that it can be used as an alignment mark on the wafer during the subsequent alignment measurement processes for the subsequent layers.

If the alignment mark 22 is a metal mark, different from the pattern portion 21, as shown on FIG. 14, the patterning of the alignment mark 22 is carried out through a procedure separate from the formation of the pattern portion 21 of the template 1. More specifically, first, formation of the pattern portion 21 is carried out. To this end, as an effective method, a resist is applied to a glass substrate of quartz, for example (FIG. 14A), an electron beam is used to draw a desired pattern thereon (FIG. 14B), and then developing and etching processes are carried out, whereby a pattern portion 21 is formed (FIG. 14C).

Here, an alignment mark table 18 on which the alignment mark 22 is to be patterned should have been processed so that it becomes lower than the projected portion of the pattern portion 21. This is because, if the projected portion of the pattern portion 21 and the alignment mark 22 are at the same level or, alternatively, the level of alignment mark 22 is made higher, during the transfer process the alignment mark 22 easily contacts to the etching barrier and the resist of the wafer, rather than the pattern portion 21 does. In consideration of it, the alignment mark table 18 is made lower than the projected portion of the pattern portion 21. As regards the processing method therefor, it will be effective to use a method in which initially the alignment mark table is processed at the same level as the protruded portion of the pattern 21 portion and subsequently, a mask is put on the pattern portion 21 and etching is performed to the whole structure while controlling the height of the alignment mark table 18.

Thereafter, a metal such as tantalum or tungsten, for example, is vapor-deposited on the alignment mark table 18 to a thickness of about 0.5 $\mu$m, for example (FIG. 14D), and a resist is applied to the metal deposition 19 surface (FIG. 14E). Then, by using an electron beam, a mark is drawn thereon (FIG. 14F), and thereafter developing and etching processes are carried out (FIG. 14G), whereby patterning of a metal-deposited alignment mark 22 is completed. During the transfer process, the pattern portion 21 is transferred onto the etching barrier and the resist on the wafer, like the conventions process. As regards the transfer of the alignment mark 22, the gap between the alignment mark 22 and the resist on the wafer is reduced to a closer space or, alternatively, they are contacted to each other, and ultraviolet-ray exposure is carried out, by which the alignment mark is transferred to the resist on the wafer. The alignment mark thus transferred to the resist of the wafer is used as an alignment mark of the wafer during the subsequent alignment measurements for subsequent layers.

In FIGS. 14A–14G, the pattern portion 21 is formed first and, thereafter, the alignment mark 22 is patterned. However, the invention is not limited to this, and the order may be reversed. That is, first an alignment mark table 20 may be formed on a glass substrate 20, and an alignment mark 22 may be patterned thereon in the manner described hereinbefore. Then, a mask may be put on the alignment mark and, after applying a resist 17 to the whole glass substrate 20, the pattern potion may be formed.

In FIGS. 13 and 14, only one set of alignment mark 22 is illustrated. Actually, however, at least three sets of alignment marks are patterned.

In this embodiment, the patterning operation is all based on electron beam exposure. However, the invention is not limited to this. Although the electron beam is used because an exposure method without using a mask is preferable for the patterning, use of a focuses ion beam for example is also effective. Furthermore, where a focused ion beam is used, the substrate may be directly processed without using a resist.

In accordance with the first to fourth embodiments of the present invention described hereinbefore, alignment measurement is enabled while using a diffraction grating for the alignment marks of the original and the workpiece substrate. As a result, high-precision alignment measurement is assured, despite the original and the workpiece substrate are not held in an approximately contacted state. Furthermore, since the alignment measurement is not carried out while keeping the original and the workpiece substrate in an approximately contacted state, adhesion of resist of the wafer to the alignment mark can be avoided, and high precision alignment measurement is ensured. Moreover, production of particles or contaminants can be suppressed. Further, since the global alignment method is usable, not only the alignment measurement precision but also the throughput can be improved. As a result, in accordance with these embodiments, a microprocessing apparatus in which high-precision alignment measurement is enabled and the overlay precision is improved, in which the throughput is improved and production of particles or contaminants is suppressed, and yet in which the productivity of semiconductor devices is improved, is accomplished.

[Embodiment 5]

Next, an embodiment of a device manufacturing method which uses a microprocessing apparatus according to any one of the first to fourth embodiments described above, will be explained.

Figure 17:
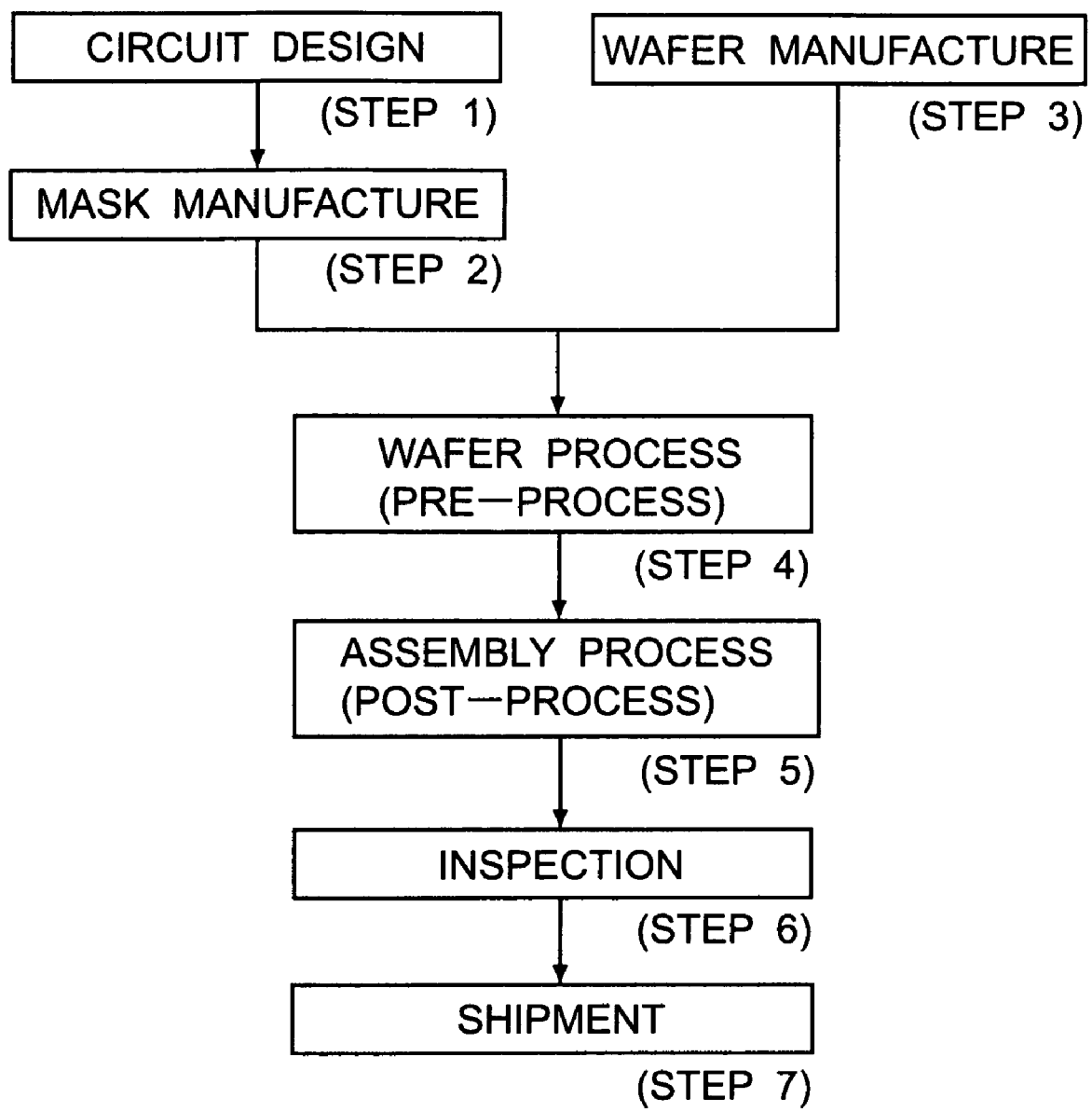
FIG. 17 is a flow chart for explaining the sequence of device manufacturing processes.

FIG. 17 is a flow chart for explaining the procedure of manufacturing various microdevices such as semiconductor chips (e.g., ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 18:
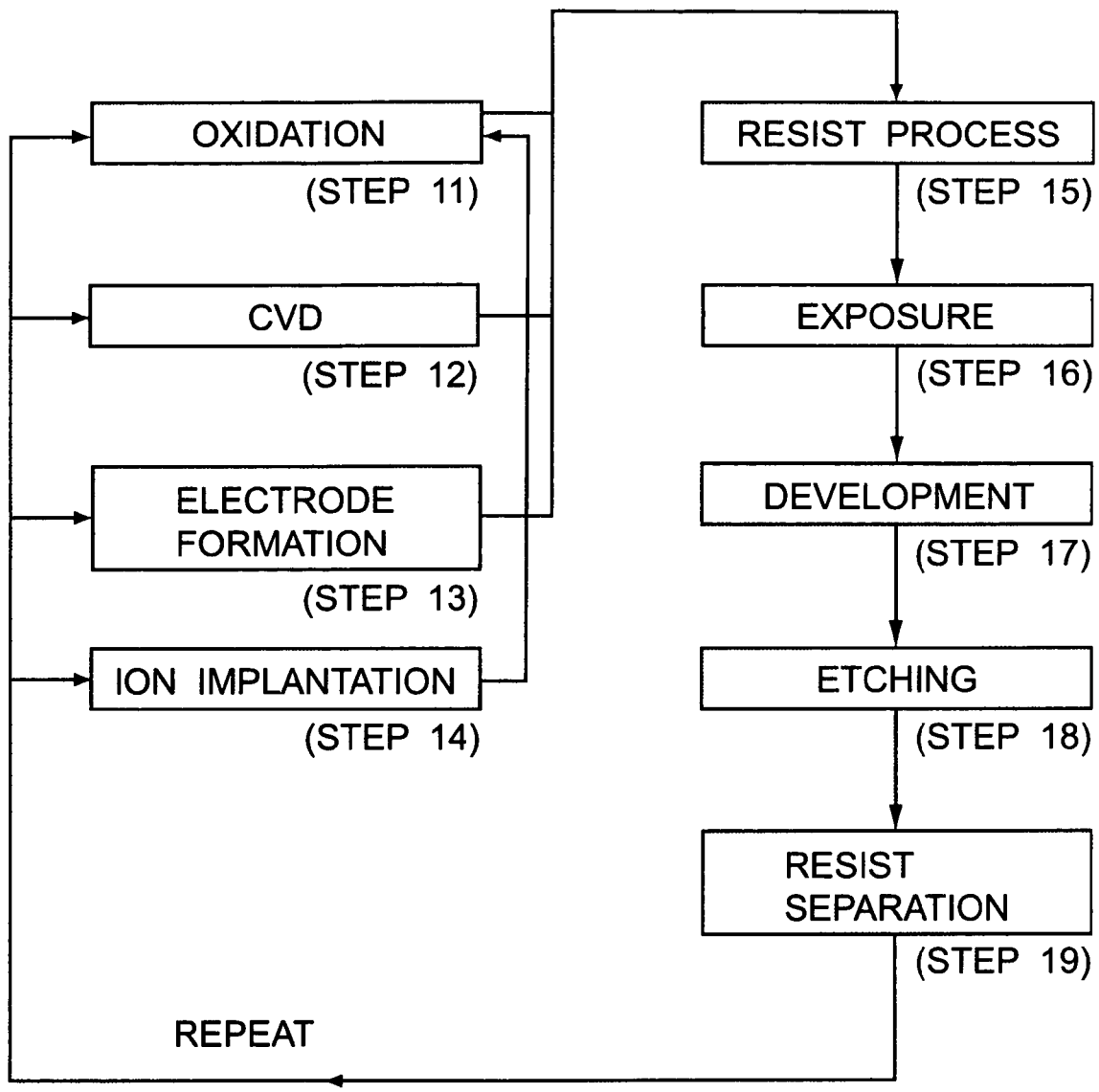
FIG. 18 is a flow chart for explaining details of a wafer process in the procedure of FIG. 17.

FIG. 18 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2003-337561 filed Sep. 29, 2003, for which is hereby incorporated by reference.

What is claimed is:

1. A microprocessing apparatus, comprising:
   original driving means for moving an original having a pattern formed thereon;
   a stage for positioning a transfer substrate;
   alignment driving means for moving an alignment substrate having an alignment mark formed thereon;
   a first alignment scope disposed on said stage, for measuring one of (i) a positional deviation between said first alignment scope and the alignment mark, and (ii) a positional deviation between a reference mark fixed with respect to said first alignment scope and the alignment mark, said first alignment scope further being operable to measure a positional deviation between the alignment mark and the original; and
   a second alignment scope for measuring a positional deviation between the alignment mark and the transfer substrate.

2. An apparatus according to claim 1, further comprising transfer means for transferring a pattern of the original onto the transfer substrate after measurement through said first alignment scope and measurement through said second alignment scope are carried out.

3. An apparatus according to claim 2, wherein a transfer pattern has a resist applied thereto, and wherein the pattern of the original is transferred to the transfer substrate by pressing the pattern of the original against the transfer substrate.

4. An apparatus according to claim 1, wherein said alignment driving means is operable to retract the alignment substrate from between the original and the transfer substrate.

5. A device manufacturing method, comprising the steps of:
   preparing an original and a transfer substrate; and
   transferring a pattern of the original onto the transfer substrate by use of a microprocessing apparatus as recited in claim 1.

6. A microprocessing method to be used with a microprocessing apparatus that includes original driving means for moving an original having a pattern formed thereon and a stage for positioning a transfer substrate, said method comprising the steps of:
   providing alignment driving means for moving an alignment substrate having an alignment mark formed thereon;
   providing a first alignment scope disposed on the stage;
   providing a second alignment scope;
   performing a first measurement process for measuring one of (i) a positional deviation between the first alignment scope and the alignment mark, and (ii) a positional deviation between a reference mark fixed with respect to the alignment scope and the alignment mark;
   performing a second measurement process for measuring a positional deviation between the alignment mark and the original;
   performing a third measurement process for measuring a positional deviation between the alignment mark and the transfer substrate; and
   performing a transfer process for transferring a pattern of the original onto the transfer substrate after said first, second and third measurement processes are completed.

7. A method according to claim 6, further comprising a retracting step for retracting the alignment substrate from between the original and the transfer substrate, after said first, second and third measurement processes and before said transfer process.

8. A device manufacturing method, comprising the steps of:
   preparing an original and a transfer substrate; and
   transferring a pattern of the original onto the transfer substrate in accordance with a microprocessing method as recited in claim 6.

* * * * *